United States Patent
Burchard et al.

(10) Patent No.: US 12,266,735 B2
(45) Date of Patent: Apr. 1, 2025

(54) DEVICE AND METHOD FOR USING DIAMOND NANOCRYSTALS HAVING NV COLOR CENTERS IN CMOS CIRCUITS

(71) Applicant: QUANTUM TECHNOLOGIES GMBH, Leipzig (DE)

(72) Inventors: Bernd Burchard, Essen (DE); Jan Meijer, Bochum (DE)

(73) Assignee: QUANTUM TECHNOLOGIES GMBH (DE)

( * ) Notice: Subject to any disclaimer, the term of this patent is extended or adjusted under 35 U.S.C. 154(b) by 625 days.

(21) Appl. No.: 17/613,750

(22) PCT Filed: May 17, 2020

(86) PCT No.: PCT/DE2020/100430
§ 371 (c)(1),
(2) Date: Nov. 23, 2021

(87) PCT Pub. No.: WO2020/239172
PCT Pub. Date: Dec. 3, 2020

(65) Prior Publication Data
US 2022/0231185 A1  Jul. 21, 2022

(30) Foreign Application Priority Data
May 25, 2019  (DE) .................. 10 2019 114 032.3

(51) Int. Cl.
*H01L 33/58* (2010.01)
*H01L 33/00* (2010.01)

(52) U.S. Cl.
CPC .......... *H01L 33/0004* (2013.01); *H01L 33/58* (2013.01)

(58) Field of Classification Search
CPC ..................... H01L 33/0004; H01L 33/58
(Continued)

(56) References Cited

U.S. PATENT DOCUMENTS 9,882,001 B2 * 1/2018 Nag ..................... H01L 29/0669
2003/0116802 A1 * 6/2003 Yamazaki ......... H01L 21/76254
257/E27.111
(Continued)

FOREIGN PATENT DOCUMENTS

CN  105158709 A  12/2015
CN  108254591 A   7/2018
(Continued)

OTHER PUBLICATIONS

D. Kim et al, "CMOS-Integrated Diamond Nitrogen-Vacancy Quantum Sensor", journal Applied Physics, Oct. 2, 2018, pp. 284-289, Massa arXiv: 1810.01056vl [physics.app-ph] Oct. 2, 2018.
(Continued)

*Primary Examiner* — Ori Nadav
(74) *Attorney, Agent, or Firm* — Michael J. McCandlish; Mindful IP PLLC

(57) ABSTRACT

A quantum-technological, micro-electro-optical or microelectronic or photonic system includes a planar substrate of a direct or indirect semiconductor material. The system includes a microelectronic circuit including at least one transistor or diode. The system further includes a microoptical subdevice and one or more nanoparticles, having one or more color centers. The surface of the of the planar substrate has a portion of a solidified colloidal film which is firmly bonded to the surface of the substrate. The portion of the solidified colloidal film includes the one or more nanoparticles. The system further includes a light-emitting electro-optical component. The light-emitting electro-optical component interacts optically with the micro-optical subdevice. The light-emitting electro-optical component interacts electrically and/or optically with the electrical component through the micro-optical subdevice. The interaction between the light-emitting electro-optical component
(Continued)

and the electrical component takes place with an involvement of the color center or a plurality of color centers.

23 Claims, 11 Drawing Sheets

(58) Field of Classification Search
USPC .......................................................... 257/98
See application file for complete search history.

(56) References Cited

U.S. PATENT DOCUMENTS

| | | | |
|---|---|---|---|
| 2005/0206311 A1* | 9/2005 | Bechtel | H10K 50/86 313/506 |
| 2005/0218397 A1 | 10/2005 | Tran | |
| 2015/0024539 A1* | 1/2015 | Brohan | H01L 31/032 60/641.1 |
| 2015/0318437 A1* | 11/2015 | Hardtdegen | H01L 33/0075 438/22 |
| 2019/0154766 A1* | 5/2019 | Lutz | G01R 15/245 |

FOREIGN PATENT DOCUMENTS

| | | |
|---|---|---|
| CN | 108983121 A | 12/2018 |
| CN | 107256047 B | 1/2019 |
| DE | 4322830 A1 | 1/1995 |
| DE | 10 2012 025 088 A1 | 6/2014 |
| DE | 10 2014 219 547 A1 | 3/2016 |
| DE | 10 2015 208 151 A1 | 11/2016 |
| JP | H05140550 A | 6/1993 |

OTHER PUBLICATIONS

B. Burchard et al, „NM Scale Resolution Single Ion Implantation Into Diamond for Quantum Dot Production 15th European Conference on Diamond, Diamond-Like Materials, Carbon Nanotubes, Nitrides and Silicon Carbide (DIAMOND 2004), Sep. 12-17, 2004, Riva del Garda, Italy.

R. Bradley et al, „Five-Nanometer Diamond with Luminescent Nitrogen-Vacancy Defect Centers, journal Small, Jul. 30, 2009, pp. 1591-1694, vol. 5 Issue 14, Wiley-VCH, Weinheim, Germany.

Huan-Cheng Chang et al, „Fluorescent Nanodiamonds, book, Sep. 12, 2018, chapters 1-5, 6-7, and 10-4 12, John Wiley & Sons Ltd.

* cited by examiner

DEVICE AND METHOD FOR USING DIAMOND NANOCRYSTALS HAVING NV COLOR CENTERS IN CMOS CIRCUITS

CROSS REFERENCE TO RELATED APPLICATIONS

The present patent application is a national stage of, and claims priority to, Patent Cooperation Treaty Application No. PCT/DE2020/100430, filed on May 17, 2020, which application claims the priority of the German patent application DE 10 2019 114 032.3, filed on May 25, 2019, the disclosures of which are incorporated in the present patent application by reference.

TECHNICAL FIELD

The disclosure is directed to apparatuses and methods of using functional nanoparticles in integrated circuits in general and of diamond nanocrystals with NV color centers in CMOS circuits in particular.

BACKGROUND

For use in quantum technology applications, NV centers in diamond crystals are preferred today. These are optically controlled and read out.

For mass technological application it would be desirable to be able to manufacture NV centers on silicon wafers in order to be able to combine them with conventional micro-electro-optical systems and thus benefit from the state of the art in photonics, plasmonics and microelectronics. Such a solution is currently unknown because of the process of making diamond layers with NV centers are not CMOS compatible due to the temperatures involved.

In their IEEE article M I Ibrahim, C. Foy, D. Kim, D R Englund, R. Han, "Room-Temperature Quantum Sensing in CMOS: On-Chip Detection of Electronic Spin States in Diamond Color Centers for Magnetometry" 2018 Symposium on VLSI Circuits Digest of Technical Papers the authors write: "Since the crystal Orientation of nano-diamond is random, the effective Bz (hence the amount of Splitting) for each Orientation varies. As a result, spectral broadening, rather than Splitting, is observed. Replacement of nano-diamond with single-crystal diamond addresses this issue." For example, from D. Kim, M. Ibrahim, C. Foy, M E Trusheim, R. Han, D R Englund, "CMOS-Integrated Diamond Nitrogen-Vacancy Quantum Sensor" arXiv: 1810.01056v1 [physics.app-ph] 2 Oct. 2018 the manual combination of a macroscopic CVD diamond with NV centers with a CMOS readout circuit is known. There is therefore an urgent need for a technology for the targeted placement of diamond nanocrystals on CMOS wafers in order to enable mass production and to circumvent these difficulties.

The placement of individual crystals with color centers on a multi-quantum-well diode in the form of a single photon source is known from DE 10 2012 025 088 A1. This technical teaching disclosed there only enables the direct combination of such a color center crystal with a light source, the manufacture of which, moreover, is not CMOS-compatible.

From DE 10 2014 219 547 A1, the placement of crystals as an admixture to a spin-on glass in connection with the manufacture of a pressure sensor is known. The states of the color centers are read out by an external lens.

The use of NEMS antennas for a readout head of a hard disk is known from US 2005 0 218 397 A1.

None of these documents discloses any solution for the construction of a compact single-chip quantum sensor system based on NV centers, since they do not disclose the reliable production of such a system and its construction.

For the purposes of this document, color centers are understood to mean paramagnetic centers in crystals. These paramagnetic centers are preferably NV centers in diamond. SiV centers and similar centers can be used if they are suitable.

SUMMARY

Therefore, the disclosure is based on the objective to create a solution which does not have the above disadvantages of the prior art and has further advantages.

The features of the claims can be combined with one another where applicable. The same applies to features within the description. The claim results from the claims.

The method for producing a quantum technological, micro-electro-optical, microelectronic or photonic system includes providing nanodiamonds with NV centers and then to stir them with a carrier (TM), for example gelatin, for example in an aqueous solution or in a solution with another suitable solvent, or a similar suitable agent to a colloidal solution of these nanodiamonds in the carrier. It is therefore an assembly principle for functional nanoparticles in MOS or CMOS microsystems. This principle can be extended in general to the assembly of functional nanoparticles in MOS or CMOS circuits or circuits manufactured in other semiconductor and/or micro-technologies.

The disclosure is explained in a schematically simplified manner on the basis of the exemplary figures.

The features can be combined with one another as far as it makes sense.

The quantum technological systems presented here preferably do not use a microwave, which requires precise alignment of the crystals. Nonetheless, some are those basic principles disclosed here are suitable for such non-microwave-free systems as well.

For the nanoparticles (NP) mentioned below, diamonds with NV centers are preferably used. Their size is preferred, but expressly not necessarily in the nano range. Other size ranges are therefore expressly included in the claim and disclosure. It was recognized according to the disclosure that, in contrast to the prior art, no microwave radiation is necessary to operate the systems so that the paramagnetic center, also referred to below as the color center, which is excited to a high level, falls to an intermediate level. In the case of diamonds with NV centers, the color center is an NV center. It is typically sufficient if the sensor element, for example the diamond crystal, has a sufficiently high density of paramagnetic centers, that is, for example, preferably a sufficient density of NV centers in diamond. An exemplary diamond crystal preferably has a NV center density of more than 0.01 ppm based on the number of carbon atoms per unit volume. Of course, lower concentrations such as, for example, of more than 0.01 ppm and/or of more than $10^{-3}$ ppm and/or of more than $10^{-4}$ ppm and/or of more than $10^{-5}$ ppm and/or of more than $10^{-6}$ ppm can be used. The fluorescence signal of the NV centers when irradiated with green light is then further weakened so that increasingly higher requirements are placed on electronic post-processing. The aforementioned density of color centers—that is, preferably the density of the NV centers—does not need to be achieved everywhere in the sensor element, i.e. the exemplary diamond. It was recognized that it is rather sufficient if this density is locally exceeded. Preferably, more than 100, better still more than 1000, better more than $10^4$, better more than $10^5$, better more than $10^6$, better more than $10^7$ paramagnetic centers (=color centers) are used for operating the sensor system. As a result of spontaneous emission, coming from the excited state after a transition time $t_d$ some of the paramagnetic centers spontaneously take an energetically lower intermediate state, which in the prior art is only achieved through the use of microwave radiation through stimulated emission.

In the case of NV centers in diamond, the sensor element can be a single diamond as well as a plurality of diamonds. The diamonds can be large or small. The diamonds can be in powder form or as granules. The diamonds can be nanocrystalline. The nanocrystalline form enables processing as a colloidal solution, which is discussed below. Preferably the quantum technological, micro-electro-optical or photonic system that is to be produced here is microwave-free, which in the case of NV centers as color centers is only achieved through the high NV center density.

DESCRIPTION

Figure 1:
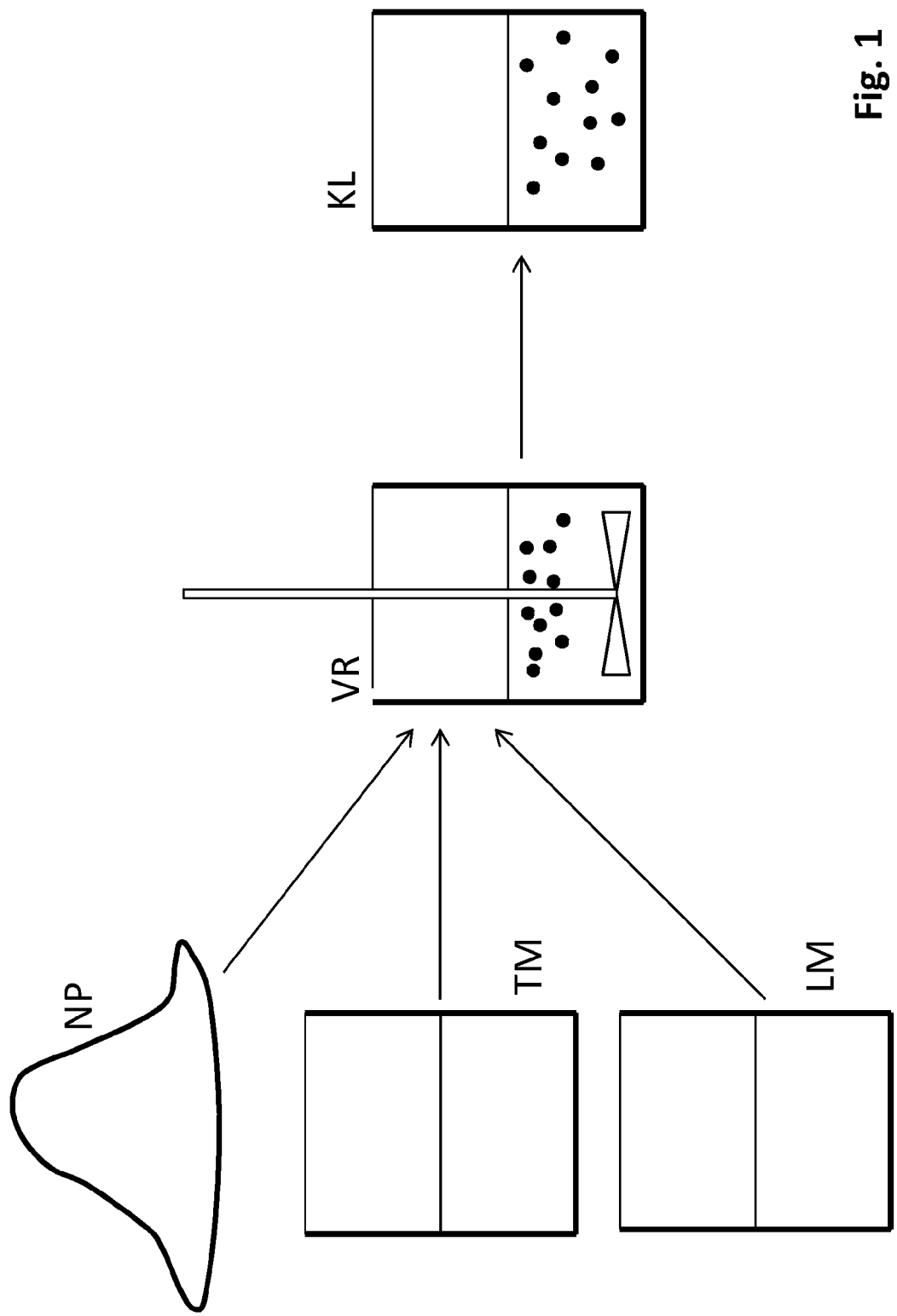
FIG. 1 illustrates an example creation of a colloidal mixture (KL).

An example is shown in FIG. 1: First of all, we assume here that the functional nanoparticles (NP) are present in sufficiently large quantities in the same form. As an example, we assume here that the nanoparticles (NP) are nanodiamonds with a color center (FZ). These are examples of other possible nanoparticles with possibly different properties and/or different color centers. In the following, the nanodiamonds are therefore also referred to with the reference symbol NP in order to represent this example for the nanoparticles per se. In the case of nanodiamonds, NV centers are preferred as color centers.

The nanodiamonds (NP) with color centers (FZ) are placed with the previously selected and provided carrier in a suitable form provided carrier (TM), for example provided as an aqueous gelatin solution, and optionally with a solvent (LM) to adjust the viscosity, for example in a container for mixing and stirred (VR) until a colloidal mixture (KL) is formed, which is suitable for the intended further processing, for example in a subsequent spin-on coating or in a printing process, for example in a screen printing process and/or in a stencil printing and/or in pad printing.

As already described, these methods are in principle not limited to the use of these carriers means (TM) (gelatin in aqueous solution) and these nanoparticles (NP), namely nanodiamonds with NV color centers as color centers (FZ). In the context of this document, the term color center includes all suitable paramagnetic centers. For example, instead of nanodiamonds with NV color centers, diamond nanoparticles as nanoparticles (NP) with SiV centers as color centers (FZ) or silicon nanoparticles with corresponding paramagnetic centers can be used if they are useful for fulfilling the technical purpose of the system to be produced. To simplify the description, we do not present all meaningful variants here. However, the claimed content also includes such combinations. Other combinations of nanoparticles (NP) of other materials and other carrier means (TM) and other solvents (LM) can also be used if the technical task to be solved by the system to be produced and the intended production method (coating and/or printing and/or local wetting) this requires. In the following mostly only the term coating is used. If applicable, this term should also include the terms lacquering, coating and/or local wetting. The reference symbol (NP) here not only stands for nanodiamonds, but also for more general nanocrystals and even more generally for nanoparticles (NP), which can also include functional elements.

These functional elements can be quantum mechanical functional elements such as color centers and/or electromagnetic functional elements such as antennas and/or nanoscale circuits and/or electronic components and/or electronic circuits and/or antennas etc.

However, these functional elements can also be ferromagnetic, diamagnetic and other paramagnetic functional elements.

The nanoparticles (NP) can be amorphous, glass-like, polycrystalline or monocrystalline.

The nanoparticles (NP) can also comprise different materials and layers.

For example, it can be silicon nanocrystals that are coated with a $SiO_2$ layer and preferably have suitable paramagnetic centers. From the prior art for example numerous different transparent lacquers are also known, which, if necessary, can each be tested for their respective suitability as a carrier mean (TM).

It is particularly pointed out that detached nanoscopic devices, such as detached MEMS or NMES antennas or other nanoscopic substructures, can also be placed in the intended manner. The nanoparticles (NP) can thus comprise nanoscopic functional elements whose operating principle is electromagnetic and/or optical (which is also an electromagnetic interaction.) and/or mechanical and/or catalytic.

For example, the MEMS and NEMS structures can be plasmonic antennas but also nanoparticles (NP), in particular nanodiamonds (ND), for example with color centers (FZ) (in the case of nanodiamonds, for example, NV and/or H3 centers) or other quantum technological functional elements.

The process described here is therefore an assembly process for a large number of nanoscopic, preferably similar objects, which, however, do not necessarily have to be objects of the same type.

Regarding the Production of the Nanoscopic Objects (Nanoparticles [NP])

Such nanoscopic objects (nanoparticles (NP)) can be produced in large numbers on a wafer, for example a silicon wafer or GaAs wafer or a diamond wafer, etc., using the photolithographic methods known from microtechnology in a first group of process steps. These nanoscopic objects (nanoparticles (NP)) can in a second group of process steps, for example, then be detached from said wafer by wet chemical means and by subsequent filtration from the wet chemical etchant that is used for detachment, to be used in the subsequent placement process.

Nanoparticles (NP) in the sense of this document are objects that are smaller than 50 nm, better smaller than 20 nm, better smaller than 10 µm, better smaller than 5 µm, better smaller than 2 µm, better smaller than 1 µm, better smaller than 500 nm, better smaller than 200 nm, better smaller than 100 nm, better smaller than 50 nm, better smaller than 20 nm, better smaller than 10 nm, better smaller than 5 nm, better smaller than 2 nm, better smaller than 1 nm.

Process for the Production of the Colloidal Varnish (KL)

We refer again to FIG. 1.

Mixing nanoparticles (NP)—here the exemplary nanodiamonds—and the carrier (TM), here, for example, aqueous gelatin, creates a processable, flowable mass, a colloidal mixture in the form of a colloidal varnish (KL). By adding more or less solvent (LM), here for example water, the viscosity of the colloidal varnish (KL) can usually be optimally adjusted. Depending on the carrier means (TM), organic and inorganic solvents (such as alcohols and/or water) are suitable as solvents (LM). It can be useful to mix different types of nanoparticles. For example, it can be useful if some of the nanoparticles are ferromagnetic or have a ferromagnetic partial device.

Method for Coating a Planar Substrate [Sub]

In order to be able to combine the functional nanoparticles (NP) with a planar substrate (sub), for example a MOS or CMOS wafer or BICMOS wafer or bipolar wafer or a planar glass or plastic wafer, a process for lacquering planar substrates (Sub) with the previously described colloidal varnish (KL) is necessary.

The basic version of the method presented here provides for the colloidal lacquer (KL) thus created to be applied to the planar substrate (sub), preferably a semiconductor substrate—for example a silicon wafer—, for example by spinning or spraying. (See FIG. 2.) With regard to the coating processes possible in the prior art, reference is made here to Marc J. Madou "Fundamentals of Microfabrication: the Science of miniaturization" CRC Press 2002, for example.

Figure 2:
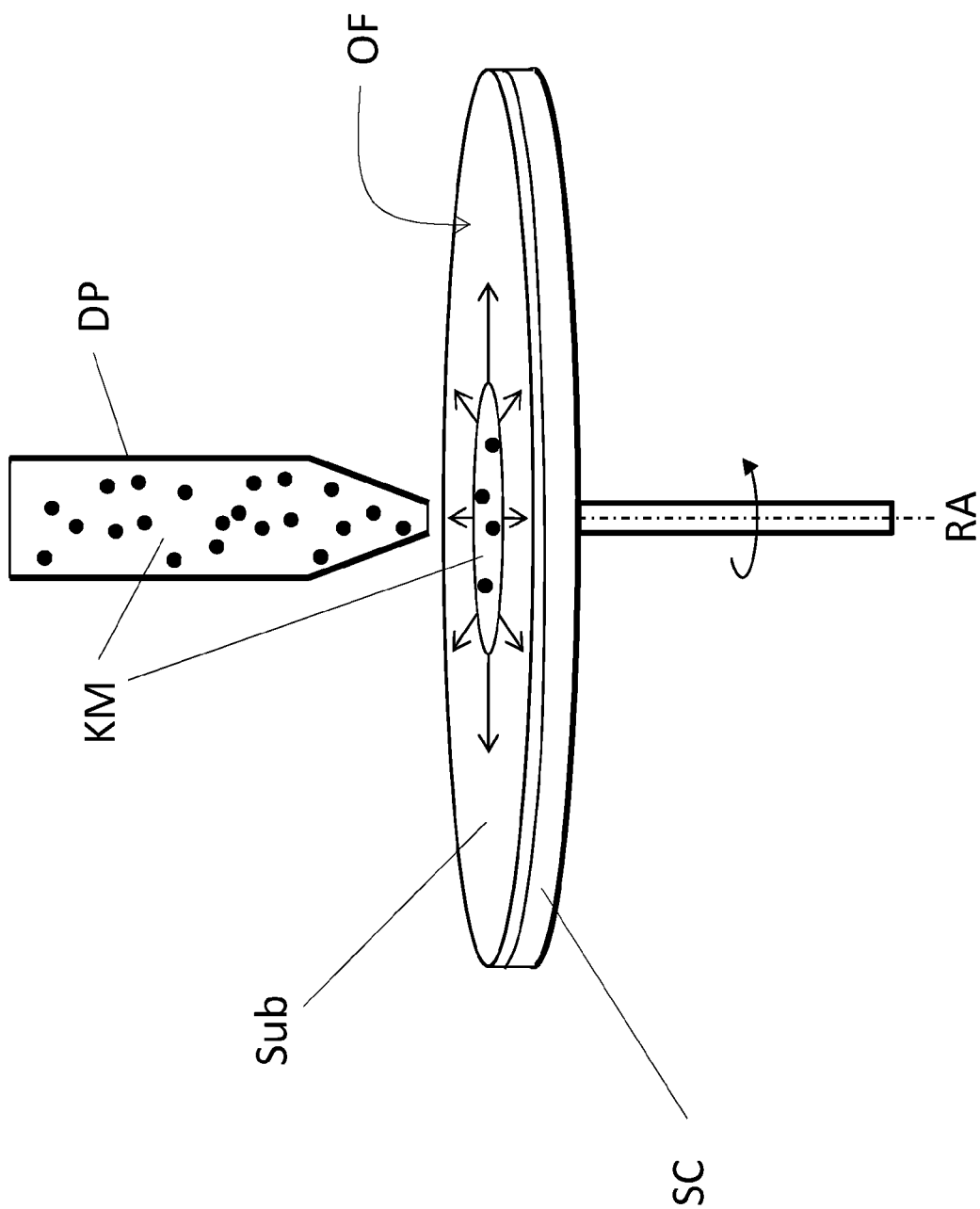
FIG. 2 illustrates an example coating process.

FIG. 2 shows an example of a possible coating process that corresponds to the coating process. The colloidal varnish (KL) is applied, for example, by means of a dispenser (DP), a special dosing device, preferably in the center of symmetry of the exemplary planar substrate (Sub), here an exemplary wafer, onto this with a preferably predetermined amount applied per unit of time. The wafer, which is the exemplary planar substrate (Sub), is placed on the turntable of a spin coater (SC). This turntable of the spin coater (SC) rotates at a process-typical speed, typically in accordance with a process-typical time speed profile. The application and the rotation speed can depend on the point in time since the beginning of the coating, for example by the dispenser (DP), in order to ensure an optimal result for the coating with the colloidal varnish (KL) and the placement of the nanoparticles (NP). They therefore preferably follow a rotation speed profile or a time profile of the application amount of the colloidal varnish (KL).

Figure 3:
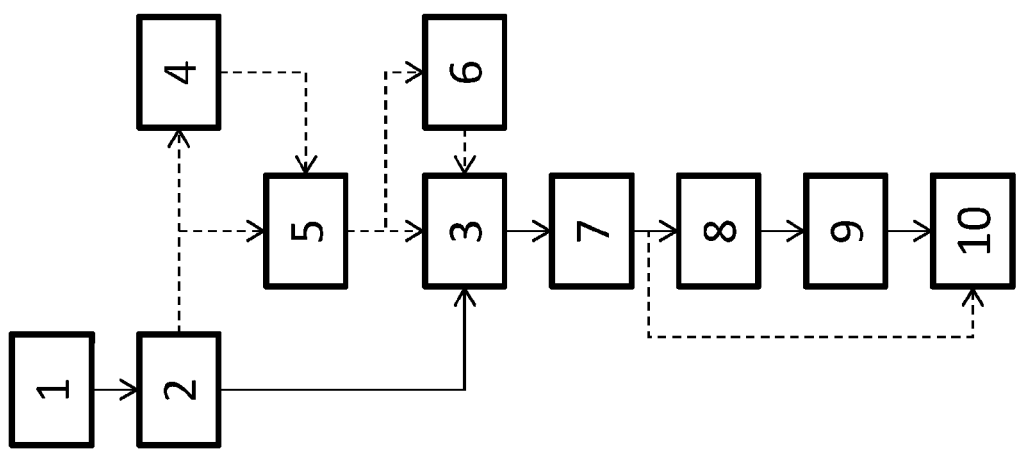
FIG. 3 is a flowchart of an example coating process.

An example coating process is shown schematically and in simplified form in FIG. 3. The relevant exemplary coating process in FIG. 3 begins with the beginning of the process (1). This is followed by providing (2) the planar substrate (Sub), preferably a semiconductor substrate—for example a wafer—and providing (3) said colloidal varnish (KL) in the form of a colloidal solution of nanoparticles (NP) in a carrier mean (TM) and possibly an additional solvent (LM). The provision (2) of the planar substrate (Sub) and the provision (3) of the colloidal varnish (KM) can take place in any order, one after the other or simultaneously. In the example of the placement of nanoparticles (NP) with color centers (FZ) as functional nanoparticle elements at least some, better all of the nanoparticles (NP) should have a functional element. In the case of placing nanocrystals as nanoparticles (NP) and in the case of color centers (FZ), all nanocrystals should have a matching color center (FZ). In the case of nanodiamonds as nanoparticles (NP) to be placed, all nanodiamonds should have a color center (FZ), for example an NV center and/or an H3 center.

Most preferably, all of the nanoparticles (NP) should have the same number of the same functional elements. In the case of placing nanocrystals as nanoparticles (NP) and in the case of color centers (FZ), all nanocrystals should very particularly preferably have the same number and the same types of color centers (FZ). In the case of nanodiamonds as nanoparticles (NP) to be placed, all nanodiamonds should have the same number of color centers (FZ), for example NV centers and/or H3 centers.

Most preferably, all of the nanoparticles (NP) should have exactly one of the functional elements. An overall structure made up of several substructures, that form a functional element, can be understood as a functional element. For example, there can be several quantum dots that can be entangled with one another or are otherwise coupled. These quantum dots can be color centers, for example. In the case of placing nanocrystals as nanoparticles (NP) and in the case of color centers (FZ), it can be useful if all nanocrystals have exactly one color center (FZ). In the case of nanodiamonds as nanoparticles (NP) to be placed, this means that all nanodiamonds then have, for example, exactly one NV center or precisely one H3 center.

The colloidal lacquer (KL) is later structured and hardened to form a structured colloidal film (FM) on the planar substrate (sub). So that this later colloidal film (FM) can adhere to the surface of the planar substrate (Sub), the colloidal lacquer (KL) of the functional nanoparticles (NP) should be able to wet at least parts of the planar substrate (Sub). This can be controlled in a known manner, for example, by one or more optional preliminary plasma treatments (5) with hydrogen or oxygen or the like. The wetting properties of the surface can also be modulated in the area (wetting vs. non-wetting) by means of a photolithography (4) preceding the plasma treatment. For this purpose, prior to the plasma treatment (5), some surface areas are selectively covered with photoresist in the said photolithography step (4), for example, and other areas that are to be treated are not covered with photoresist so that they are exposed to the plasma. Such a modulation of the wetting properties would thus be a further optional additional work step in the form of a photolithography (4), which is conceivable. (See FIG. 3)

After the plasma treatment (5), the cover lacquer is typically removed again (6) if the said photolithography step (4) was carried out beforehand.

This is then followed by lacquering (7) the planar substrate (Sub) with the colloidal lacquer (KL) of the nanoparticles (NP) in order to obtain a colloidal film (FM) on a surface (OF) of the planar substrate (Sub) (see also FIG. 2) This is done, for example, by sinning and/or spraying and/or printing on a previously created colloidal varnish (KL).

As a rule, the colloidal lacquer (KL) with the nanocrystalline nanoparticles (NP) it contains is then hardened to a colloidal film (FM) (8) to such an extent that it is mechanically stable enough for further processing, but also can be structured by means of other subsequent process steps. This structuring (9) of the colloidal film (FM) is usually preferably carried out using photolithographic methods. Such a structuring (9) is not absolutely necessary. In some applications it may be sufficient to apply the colloidal varnish (KL) using one of the said varnishing methods, i.e. to carry out varnishing (7), and to completely and directly harden (10) the colloidal varnish (KL). Beside to the said photolithographic processes the structuring (9) is also conceivable by means of micromechanical processes (scoring, milling). Excimer lasers and particle beams such as electrons and/or ion beams can also be used for structuring. Either the carrier material (TM) of the colloidal varnish (KL) or the colloidal film (FM) resulting from it is itself a photoresist material and thus the colloidal varnish (KL) is a photoresist or the photoresist is applied to the colloidal lacquer (KL) as an overlying layer. In the latter case, the photoresist should be chosen so that it can be selectively structured towards the colloidal lacquer (KL) or towards the colloidal film (FM) and the colloidal lacquer (KM) or colloidal film (FM) can be selectively structured towards the photoresist.

However, a variant of the colloidal lacquer (KL) with a suitable photosensitive support material (TM), for example a suitable photosensitive polyimide, is preferred.

The preferably photolithographic or micromechanical structuring (9) of the colloidal lacquer (KL) to form the colloidal film (FM) then takes place. After structuring (9), the final hardening (10) of the colloidal film (FM) typically takes place.

Using the proposed method, it is thus possible to locally place any nanoparticles (NP) and functional nanoparticles (NP) specifically on a wafer, in particular on a CMOS wafer or BICMOS wafer or bipolar wafer or a planar glass or plastic wafer.

Preferred nature of the nanoparticles (NP) The nanoparticles (ND) are particularly preferably nanocrystals with a crystal size of less than 1 μm and/or less than 500 nm and/or less than 250 nm and/or less than 100 nm and/or less than 50 nm and/or less than 25 nm and/or less than 10 nm and/or less than 5 nm and/or less than 2.5 nm and/or less than 1 nm.

The use of diamond nanocrystals and/or Si nanocrystals is preferred.

The nanoparticles (NP) preferably have a functional element. This functional element is preferably a color center (FZ) that is suitable and intended for this purpose predefined electromagnetic radiation and/or predefined electromagnetic fields to interact in particular by absorption and/or radiation.

In the case of nanodiamonds as nanoparticles (NP), at least one color center (FZ) is preferably an NV center (NV) or an H3 center or a SiV center in the diamond nanocrystal.

It can be useful to mix different types of nanoparticles. For example, it can be useful if some of the nanoparticles are ferromagnetic or have a ferromagnetic partial device.

A nanocrystal as a nanoparticle (NP) can have several color centers (FZ) of the same or different types. Each nanocrystal preferably has at least one suitable color center (FZ). Even better, every nanocrystal has at least exactly one suitable one-color center (FZ). Even better, every nanocrystal has at least exactly one suitable one-color center (FZ) of one kind of color center. Even better, everyone has at least exactly one suitable color center (FZ) of one type of color center and no color center of another type of color center. Even better, all nanocrystals each have exactly one suitable color center (FZ) of a first type of color center and no color center of another type of color center. However, these are not mandatory requirements. Color center type is understood here to mean the specific atomic structure of a color center in the crystal, for example NV centers in diamond or SiV centers in diamond or H3 centers in diamond.

The use of nanocrystals made of III/V material and/or II/VI material and/or a direct semiconductor material or mixtures thereof as nanoparticles (NP) is also conceivable. A potential monofrequency single photon excitation ability of an electromagnetic functional element, e.g. a paramagnetic center, of such a nanoparticle (NP) can be understood as a color center (FZ).

In this respect, nanoparticles (NP) can also be electromagnetically interacting nanostructures, for example nanomechanical electromagnetic and/or electromechanical resonators and/or antenna structures which have a resonance frequency that can be electromagnetically excited by a single photon. In the extreme case, it can also be point, line or area crystal defects. The method here is a method for the targeted, spatially resolved placement of individual functional nanoparticles (NP) in nanoscopic dusts on a planar substrate (sub).

Process for the Production of Preformed Nanoparticles (NP)

Figure 4:
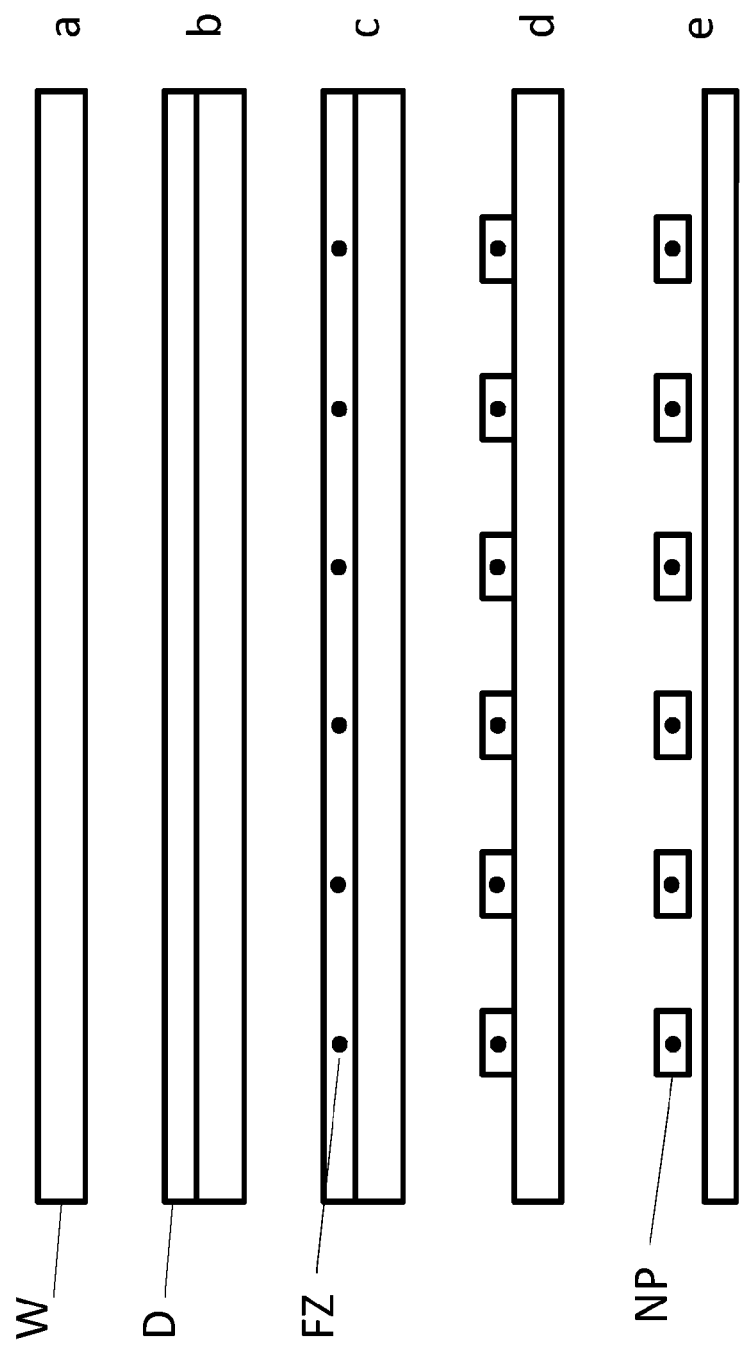
FIG. 4 illustrates an example fabrication process for preformed diamond nanoparticles (ND).

FIG. 4 shows an exemplary method for producing preformed diamond nanoparticles (ND) as an example for the microtechnological production of functional nanoparticles (NP). In principle, the process can be transferred to materials other than silicon as a wafer material if the appropriate etchants are adapted.

First, a deposition substrate (W), for example a silicon wafer, is provided (FIG. 4a). A functional layer, for example a diamond layer, is deposited on this deposition substrate (W) (FIG. 4b). A wide variety of methods for depositing diamond layers, for example by means of CVD methods, are known from the prior art, so that these do not have to be explained further here. As an example, reference is made here to the book Koji Kobashi, "Diamond Films: Chemical Vapor Deposition for Oriented and Heteroepitaxial Growth" Elsevier Science, Nov. 30, 2005, ISBN 9780080447230.

A process step for reducing the hydrogen concentration is preferably carried out in such a process in order to remove excess hydrogen from the diamond layer deposited by means of CVD. It is preferably a heat treatment at high temperature and preferably at high pressure. In an example, this takes place during the deposition cyclically with the deposition in order to make the low diffusion rate in diamond ineffective. Diamond layers are typically deposited in the presence of hydrogen, which prevents the formation of NV centers in the diamond. Due to the cyclic deposition, the hydrogen can diffuse out of the few deposited layers and leave the layer despite the low diffusion rate. In this way, the hydrogen content can be reduced.

Doping the diamond layer with dopants is also recommended to increase the NV center yield. For example, doping the diamond layer with sulfur comes into consideration here. The doping can take place during the deposition and/or by ion implantation.

The diamond layer preferably has a predetermined crystal orientation. Regarding the growth of pre-oriented diamond layers, reference is made to the prior art.

The diamond layer is preferably isotopically pure in order to keep the interaction between the NV centers and the diamond lattice in a predefined ratio. It is preferably an isotopically pure diamond layer made of $^{12}C$ carbon or alternatively made of $^{13}C$ carbon or alternatively made of $^{14}C$ carbon. Isotope-pure means that the isotope in question dominates and the concentration of the other carbon isotopes is reduced by at least a factor of 10 compared to their proportion in natural carbon deposits.

After a suitable functional layer (D) has been deposited, the color centers (FZ) are then generated at preferably predetermined positions in the functional layer (D), for example by individual ion implantation.

As exemplary literature for this can be mentioned:

Burchard B., Meijer J., Rangelow I., Bischoff L.; "NM Scale Resolution Single Ion Implantation Into Diamond for Quantum Dot Production" 15th European Conference on Diamond, Diamond-Like Materials, Carbon Nanotubes, Nitrides and Silicon Carbide (DIAMOND 2004), At 12-17 Sep. 2004 • Riva del Garda, Italy;

Meijer, J, Rangelow, I., Burchard, B.; "A Set Up for Quantum Dot Generation by Means of Ultra High Resolution Single Ion Implantation" WE_Heraeus-Seminar, Bad Honnef, Germany 13.—15 Oct. 2003;

Meijer, J., Pezzagna, S., Vogel, T., Burchard, B., Bukow, H. H., Rangelow, L W., Sarov, Y., Wiggers, H., Plümel, I., Jelezko, F., Wrachtrup, J., Schmidt-Kaler, F., Schnitzler, W., Singer, K., "Towards the implanting of ions and positioning of nanoparticles with nm spatial resolution" Appl. Phys. A 91, 567-571 (2008).

In a final step, the functional nanoparticles (NP) are detached from the deposition substrate (W) (FIG. 4e).

In the method of FIG. 4, the nanoparticles (NP) are preferably manufactured as nanocrystals with a fixed crystal orientation relative to the surface of the deposition substrate (W).

The nanoparticles (NP) then preferably do not have a fully symmetrical structure, but rather have reduced or nonexistent symmetry.

If, for example, nanodiamonds are manufactured as nanoparticles (NP) in this way, NV centers can be manufactured as color centers (FZ). Their optical, electromagnetic and quantum mechanical properties depend on the crystal direction. For example, it makes sense if the [111] direction of the nanodiamonds after assembly coincides with the pointing vector of the irradiating electromagnetic field and/or the direction of the flux density B of an external electromagnetic field. For this purpose, it makes sense to provide the nanoparticles (NP), here for example the nanodiamonds, with a suitable mechanical shape so that they are arranged in a predetermined manner on the surface of the later target substrate, the planar substrate (Sub).

There are also various other methods for manufacturing the exemplary diamond nanocrystals as nanoparticles (NP) with exemplary NV centers as color centers (FZ). The following texts can be named as examples:

Xerui Song, GuanzHong Wang, Xiaodi Lui, Fupan Feng, "Generation of nitrogen-vacancy color center in nanodiamonds by high temperature annealing", Applied Physics Letters 102(13), April 2013;

Taras Plakhotnik, Haroon Aman, "NV-centers in Nanodiamonds: How good they are" Diamond and Related Materials 82, December 2017;

Bradley R. Smith, David W. Inglis, Bjomar Sandness, Taras Plakhotnik, "Five-Nanometer Diamond with Luminescent Nitrogen-Vacancy Defect Centers" Small 5(14): 1649-1653; March 2009, "Photoluminescence of color centers in nanodiamonds" in "Nanodiamonds" p. 155-181;

Huang-Cheng Chang, Wesley Wie-Wen Hsiao, "Fluorescent Nanodiamonds", Wiley; edition: 1 (12 Sep. 2018);

Jean-Charles Arnault "Nanodiamonds: Advanced Material Analysis, Properties and Applications (Micro and Nano Technologies)", Elsevier; edition: 1 (25 Apr. 2017);

Vadym N. Mochalin, Yury Gogotsi, "Nanodiamond—polymer composites" Diamond & Related Materials 58 (2015) 161-171.

The above list is not exhaustive. None of the above documents deal with the installation of the nanocrystals in micro-optical systems or MOS or CMOS circuits or BIC-MOS Circuits or bipolar circuits or in thick-film systems on planar glass, ceramic or plastic substrates, which is a major obstacle to series production.

Figure 5:
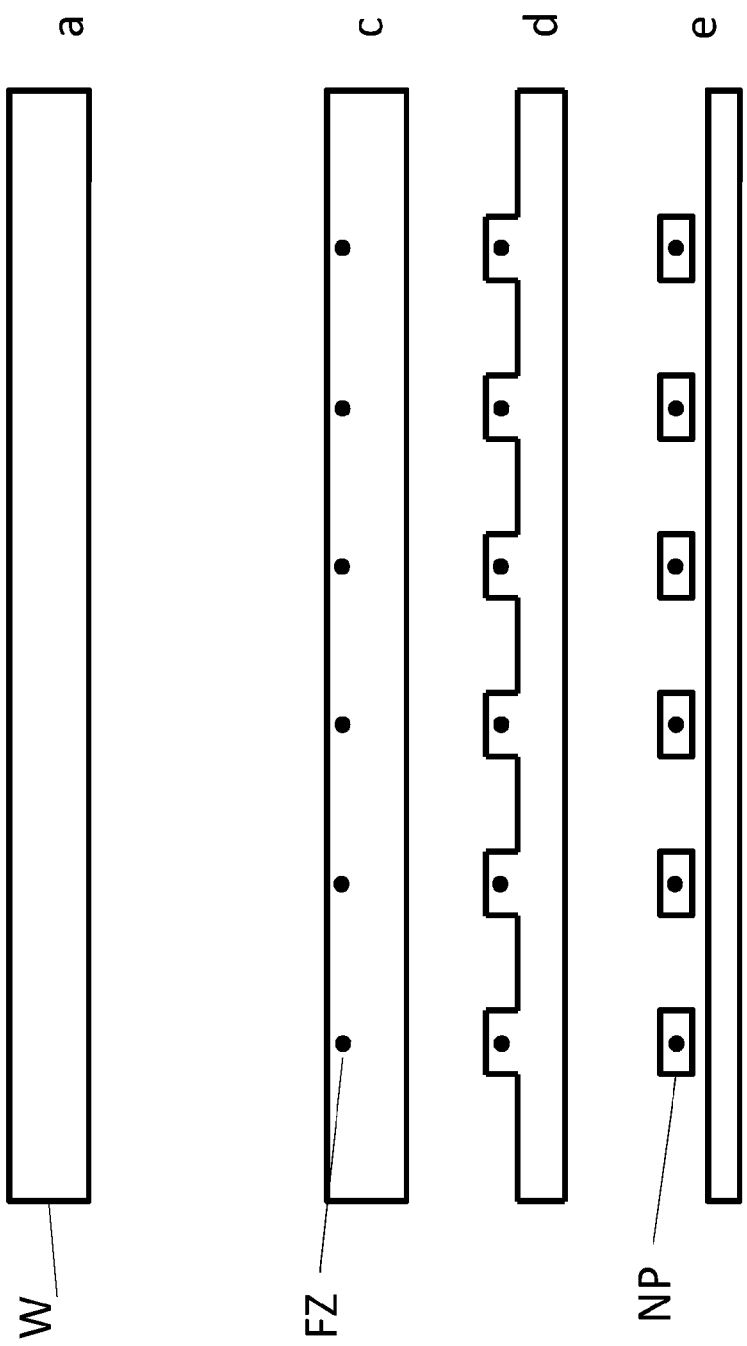
FIG. 5 illustrates an example process for the fabrication of preformed diamond nanoparticles (ND) based on a deposition substrate (W).

FIG. 5 shows another process in which a no further structured deposition substrate (W), for example made of diamond as a monocrystalline or polycrystalline diamond wafer with a preferably defined crystal orientation, is provided (FIG. 5a). The diamond wafer is preferably isotopically pure. Alternatively, the diamond wafer can also have a reduced proportion of other carbon isotopes.

The color centers (FZ), for example the NV centers, are then produced in the substrate (W) (FIG. 5c). This can be done, for example, by ion implantation of nitrogen and subsequent temperature treatment. This is followed by structuring, for example by means of photolithography and RIE plasma etching (FIG. 5d). In a final step, the nanoparticles (NP), here the exemplary nanodiamonds, are detached from the deposition substrate (W), for example by undercutting. Instead of a diamond substrate as the deposition substrate (W), for example, a silicon wafer or the like can also be used.

Nanoscopic Objects as Nanoparticles (NP)

In developing the invention, it was recognized that the placement of nanoscopic objects is a problem in general. It is not only about placing the nanoscopic objects in a certain location, for example on a wafer with, for example, a large number of photonic systems, but also about aligning the nanoscopic objects that are used as nanoparticles (NP), since the functional properties, especially the quantum optical properties, depend on the orientation within the nanoparticle (NP). For this purpose it is advantageous if the outline of such a nanoparticle (NP) and the crystal structure of the material of such a nanoparticle (NP) are defined relative to the outline of such a nanoparticle (NP).

By means of an asymmetrical outline of such a nanoparticle (NP), a preferred attachment direction of the nanoparticle (NP) on microfluidic structures on the planar substrate (Sub) can be achieved during the coating (see FIG. 2) with the colloidal varnish (KL) of the nanoparticles (NP) will. More on this later.

Placement Support for the Nanoparticles (NP) by Microfluidic Functional Elements When working out the invention, the first thing that was in the foreground was the use of a spin coater (SC) that is common in microtechnology. It was recognized that the course of the colloidal varnish (KL) during the spin-on of the colloidal varnish (KL) can be controlled by microfluidic structures on the planar substrate (sub).

Figure 6:
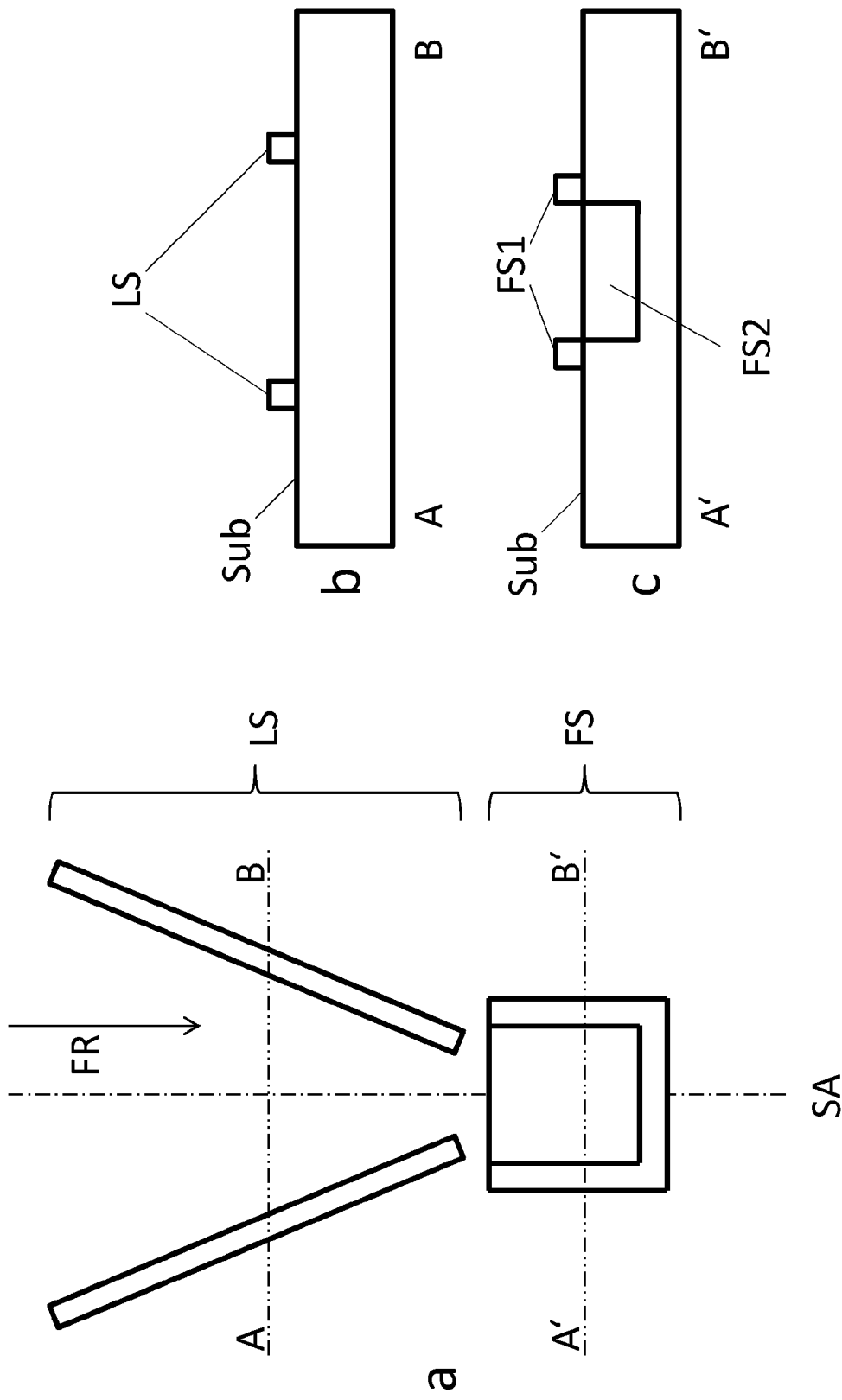
FIG. 6 illustrates an example microfluidic structure to support placement and, if necessary, alignment of the nanoparticles (NP) during the coating of the planar substrate (Sub) with a colloidal coating (KL).

FIG. 6 shows an exemplary microfluidic structure to support the placement and, if necessary, alignment of the nanoparticles (NP) during the coating of the planar substrate (Sub) with the colloidal varnish (KL).

The microfluidic structure consists of a first partial structure, the lead structure (LS), the purpose of which is to capture a predetermined amount of nanoparticles (NP) within the colloidal lacquer (KL) while streaming by in the lacquer process and to guide them in the direction of the catching structure (FS) for the nanoparticle (NP).

The lead structure (LS) is characterized by the fact that it does not prevent the movement of the nanoparticles (NP) but directs it towards a target. Therefore, the conductive structure should align with the lacquer flow direction (FR) of the colloidal varnish (K1) during the lacquer coating. In the case of a rotationally symmetrical wafer as a planar substrate (Sub), the preferably existing axis of symmetry (SA) should be oriented towards the axis of rotation (RA) of the coating centrifuge (SC) (see also FIG. 1). It is therefore reasonable to produce these microfluidic structures not by exposing a photoresist using a stepper but rather by exposing a photoresist using a whole wafer mask and a light source with optics.

In the example of FIG. 6, the guiding structure (LS) consists of two grooves, which are preferably produced by micro-structuring on the planar substrate (sub) prior to the coating with the colloidal lacquer (KL). Possibly. will be the planar substrate (sub) is polished prior to making these microfluidic functional elements (LS, FS, FS1, FS2).

If, for example, it is a CMOS wafer or a BICMOS wafer or a bipolar wafer or a planar glass, ceramic or plastic wafer, it makes sense to polish this wafer using CMP, for example, before manufacturing the microfluidic functional elements (LS, FS, FS1, FS2).

In the example of FIG. 6, the microfluidic structure has a catching structure (FS) with a plurality of lower sub-structures (FS1, FS2) as the second partial structure, the task of which is to fix at least one nanoparticle (NP), if possible. In the example in FIG. 6, this is done by a first partial catching structure (FS1), which reduces the probability of a nanoparticle (NP) to escape once it has been caught. In the example of FIG. 6 it is a structure which is preferably produced in the same work step as the guiding structure (LS). This is an example of a spring structure that protrudes from the surface of the planar substrate (Sub). In the example in FIG. 6, the first catching sub-structure (FS1) forms a U-shaped cup which is open towards the guide structure (LS).

In addition to the first catch part structure (FS1), in the example of FIG. 1 the catch structure (FS) also has, by way of example, a second catch part structure formed by an exemplary recess (FS2) made in the surface of the planar substrate (Sub), for example by etching.

The partial FIG. 6a represents a schematic, simplified plan view of the exemplary microfluidic structure. The partial FIG. 6b represents a schematic, simplified cross section along the line A->B of FIG. 6a. The partial FIG. 6c represents a schematic, simplified cross section along the line A.'->B' of FIG. 6a.

Thus, for example, ribs tapering towards the edge as a guide structure (LS) lead to an increased probability of a nanoparticle (NP) being placed in a depression as a second catching part structure (FS2) in the surface of the planar substrate (Sub) at the end of this structure, if this is aligned according to the coating flow direction (FR).

Figure 7:
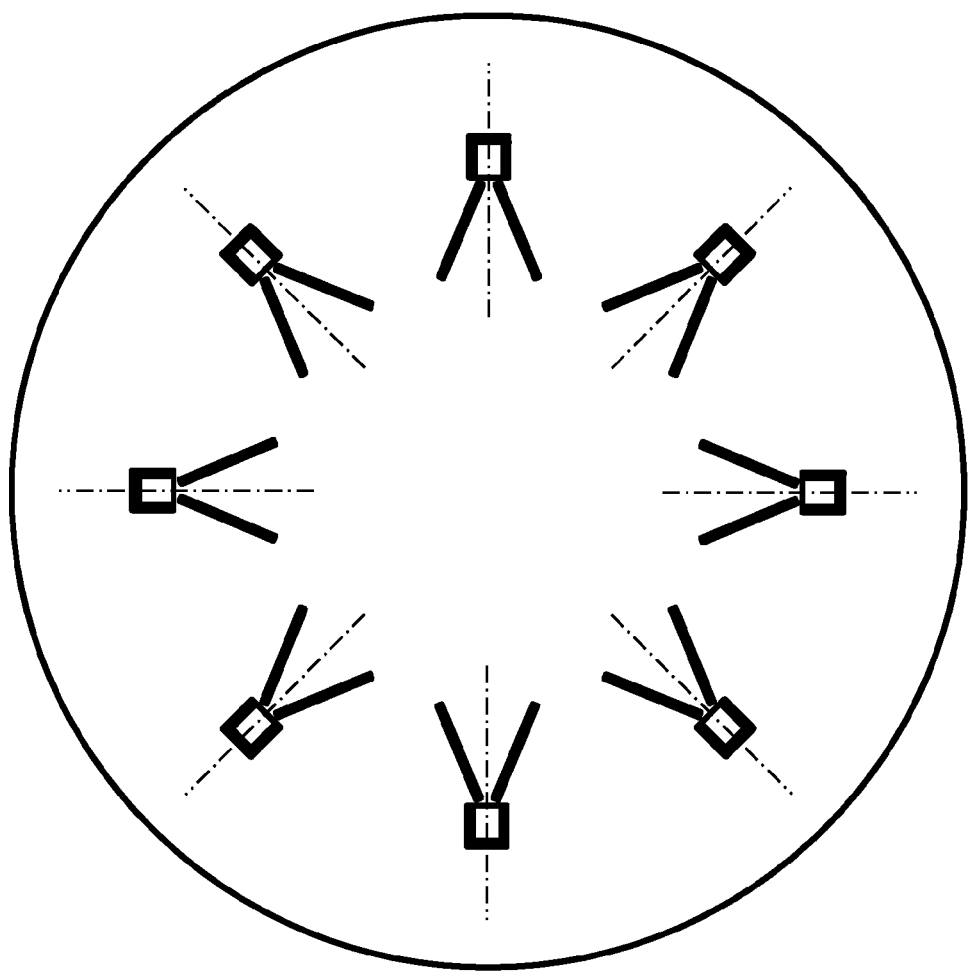
FIG. 7 illustrates example trapping structures (FS) and guiding structures (LS) symmetrically aligned with a center of a typically round wafer.

A particular difficulty in production arises from the fact that these catching structures (FS) and guiding structures (LS) should preferably be aligned symmetrically to the center of the typically round wafer, which should be identical to the axis of rotation (RA) of the coater (SC), because the centrifugal forces have this rotational symmetry. This is shown in FIG. 7 for the structures of FIG. 6 by way of example and not to scale, only for illustration, in a very simplified manner in principle for clarification.

This rotationally symmetrical arrangement means that during the production of at least the microfluidic structures (capturing structures FS and guiding structures LS) the wafer (planar substrate Sub) has to be rotated during exposure in the stepper, which would require a special stepper and is very expensive. An inexpensive alternative is to use a whole wafer mask, as it is still common in many places in micromechanical production. This is particularly useful because the microfluidic structures are anyway typically rather macroscopic in the µm range. The microfluidic functional elements (FS, LS, FS1, FS2) control the lacquer flow of the colloidal varnish (KL) and thus the movement of the nanoparticles (NP) during the coating (e.g., FIG. 2).

At least one of the microfluidic functional elements (FS, LS, FS1, FS2) is therefore preferably provided and/or suitable, during the lacquering or coating and/or local wetting of the planar substrate (Sub) with the colloidal lacquer (KL) with one of the Nanoparticles (NP) to enter into mechanical or fluid mechanical interaction in order to ultimately influence their placement and, if necessary, alignment. Of course, it is conceivable that further microfluidic functional elements are provided, which may be nothing at all have to do with the manufacturing process, but which, for example, will only take over a function during later operation of the system. This can be useful, for example, in medical applications of the systems for controlling body fluids, etc. It makes sense to manufacture the further microfluidic functional elements at least partially together with the microfluidic functional elements (FS, LS, FS1, FS2) provided for placing the nanoparticles (NP).

As already mentioned, it is typically but not always advantageous to manufacture any microelectronic circuit parts to be manufactured in the planar substrate (Sub) before the microfluidic functional elements (FS, LS, FS1, FS2) in the process sequence. This typically also applies to micro-optical functional elements.

On the Preferred Nature of the Planar Substrate (Sub)

The planar substrate (sub) preferably comprises a semiconductor wafer and/or another semiconductor substrate and/or a silicon wafer and/or a GaAs wafer and/or a wafer made of IV material and/or a wafer made of III/V material and/or a wafer made of II/VI material and/or a wafer made of mixtures of such materials and/or a germanium wafer and/or a mono- or polycrystalline diamond wafer and/or a glass wafer and/or a ceramic wafer and/or a metal sheet and/or a plastic plate. The planar substrate (Sub) is preferably at least partially electrically semiconducting.

Possibly, these can be wafers which are stacked to wafer packets by gluing or the like and are structured photolithographically or in a similar way.

The planar substrate (Sub) preferably comprises a micro-integrated circuit. The planar substrate (Sub) is therefore preferably at least partially electrically semiconducting.

For the technology disclosed here, it is therefore particularly advantageous if a method for producing electronic components is already applied to semiconductor substrate and/or if a method for the production of electronic MOS or CMOS or BICMOS or bipolar components is carried out on the semiconductor substrate before the introduction of the nanoparticles the nanoparticles (NP).

The planar substrate (sub) is therefore preferably a MOS, CMOS or BICMOS wafer or a wafer that is manufactured using bipolar technology, that has a microelectronic circuit for controlling a light source and/or a light-sensitive component (e.g., a photodiode) for detecting the luminescence of the color center (NV) and/or a microelectronic circuit for evaluating the measurement signal of this light-sensitive component. An electronic circuit in the sense of this disclosure comprises an interconnection of at least two microelectronic components that are manufactured in the planar substrate (sub). The microelectronic circuit preferably comprises at least one transistor as a microelectronic component. It is preferably a MOS transistor. Preferably the microelectronic circuit comprises at least one transistor, e.g., an N-channel MOS transistor or an NPN bipolar transistor, and at least one transistor complementary thereto, e.g., a P-channel transistor or a PNP transistor, these two transistors then being part of the same microelectronic circuit and these two transistors then being manufactured in the planar substrate (Sub).

For example, the planar substrate (sub) can also be a MEMS wafer which has at least one micromechanical and/or microelectromechanical functional element, for example a membrane and/or a cantilever (=beam or carrier). It can also be a co-integrated CMOS-MEMS wafer and/or BICMOS-MEMS wafer or bipolar wafer, whereas a device made from them, generally called a chip, then comprises a microelectronic circuit, for example a MOS or CMOS or BICMOS or bipolar circuit, and a micromechanical functional element. Such a chip then preferably has a nanoparticle (ND) which is firmly connected to the planar substrate (Sub) by means of a fastening means, for example a solidified carrier means (TM). The nanoparticle (ND) preferably has said paramagnetic center, for example one or more NV centers in diamond. Preferred a micro-optical functional element, particularly preferably an optical waveguide, is manufactured in or firmly connected to the planar Substrate (sub), which preferably has the paramagnetic center or centers of the nanoparticle (ND) with a light-emitting component of the micro-integrated circuit, for example a MESA structure (MS) described later, which is preferably manufactured in or on the planar substrate, and/or is optically coupled to a light-sensitive microelectronic component of the micro-integrated circuit, for example a light-sensitive PN diode (pG, nG). The microelectronic circuit can be supplemented by further micro-optical functional elements.

Figure 8:
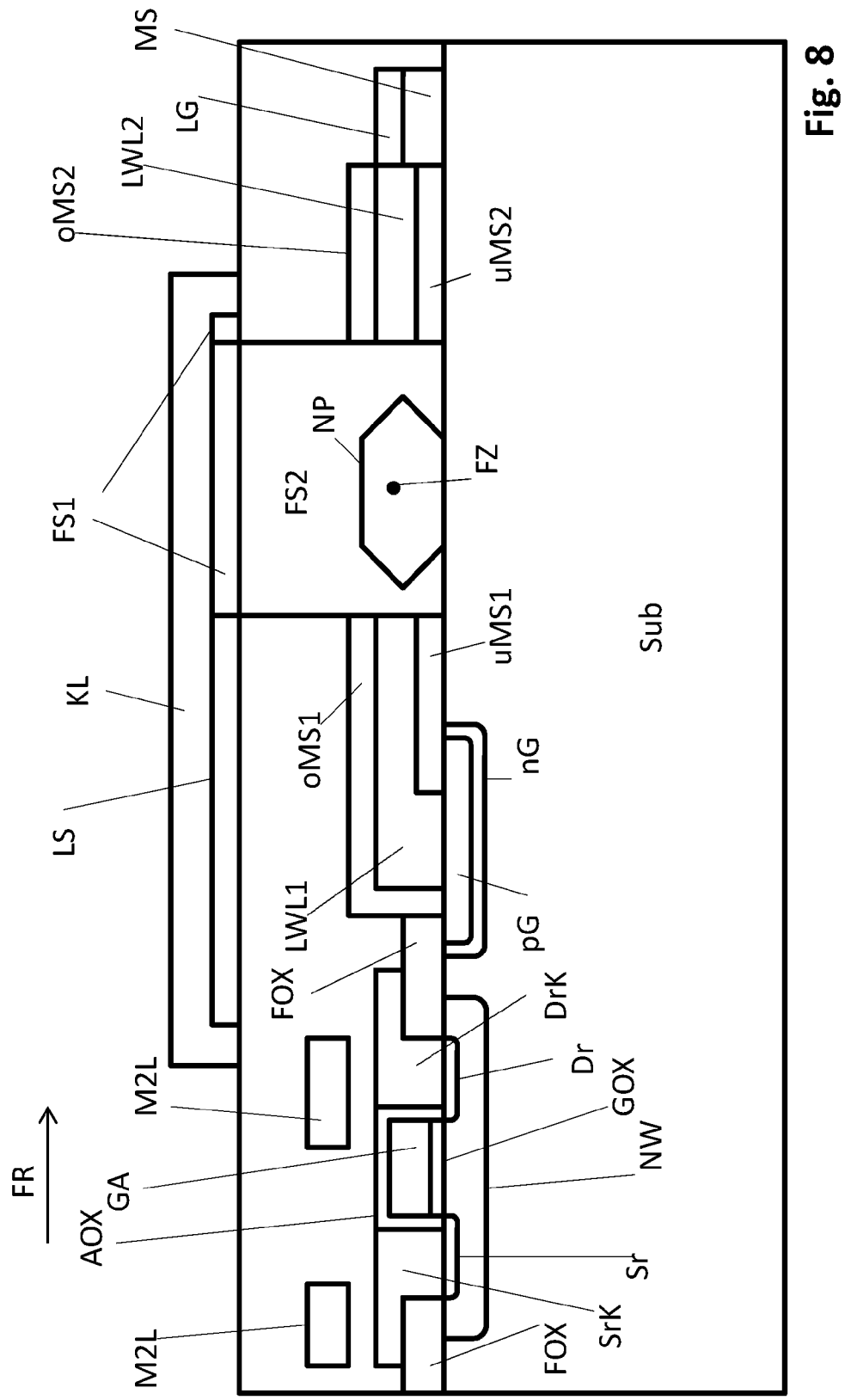
FIG. 8 illustrates schematically and roughly an example cross-section of an exemplary system of an exemplary MOS, CMOS, BiCMOS, or Bipolar system with nanoparticles (NP).

FIG. 8 shows, schematically and in a roughly simplified manner, a cross section through an exemplary MOS, CMOS, BiCMOS, or Bipolar system with nanoparticles (NP) in order to clarify the content of the previous discussion. The basis of the exemplary device is the planar substrate (sub). For the sake of clarity, this is intended to be for example a silicon wafer piece (generally referred to as chip or die) with a p-type conductivity, as in MOS and CMOS and BICMOS and bipolar-technique is common today. The explanations here can of course also be applied to the bipolar technique. Before the introduction of the nanoparticles (NP), a MOS or CMOS or BICMOS or a bipolar process was carried out with the exemplary planar substrate (Sub), here the silicon wafer. A microelectronic circuit was produced on the silicon wafer by this process, converting it into a MOS wafer or into a CMOS wafer or into a BICMOS wafer respectively or a bipolar wafer respectively. Symbolically for such a microelectronic circuit, a single exemplary MOS transistor is indicated schematically in simplified form. There you can also think of a bipolar transistor or similar components such as thyristors and the like. This simplified representation is intended to ensure that the basic principle is clear without confusing details. The simplified representation is intended to express the co-integration of a microelectronic circuit with the nanoparticle (NP) with the paramagnetic center or the plurality of paramagnetic centers, represent some pathways. Functionality cannot be shown here due to the complexity of the presentation required.

In this example, the MOS transistor shown by way of example comprises an N-well (NW) in the planar P-substrate (Sub). The indicated exemplary MOS transistor has a source region (Sr), a drain region (Dr), a source contact (SrK) for contacting the source region (Sr), a drain contact (DrK) for contacting the drain region (Dr), a gate oxide (GOX), a field oxide (FOX), a cover oxide (AOX) and a gate (GA). Above the microelectronic components is the metallization stack of the micro-integrated circuit, indicated by a second metal layer (M2L) which is electrically insulated upwards and downwards and which is structured. In reality, the MOS, CMOS, BICMOS and bipolar structures are essentially more complicated. They typically include, for example, multiple layers of metal and polycrystalline silicon. It is therefore based on the relevant prior art regarding microelectronic circuits. The structure of the device in FIG. 8, which is used for clarification, includes exemplary micro-optical components in the form of exemplary fiber optic cables (LWL1, LWL2). In the illustrative example in FIG. 8, these are intended to interact with a color center (FZ) and a nanoparticle (NP). The nanoparticle (NP) can preferably be a nanodiamond with an NV center as a color center (FZ). The nanoparticle (NP) has been placed in the recess of the second trap structure (FS2) by means of the guide structure (LS) and the first trap structure (FS2). The colloidal lacquer (KL) covers the surface of the device in the area of the conductive structure (LS) and the area of the trap structure (FS1, FS2) to fix the position of the nanoparticle (NP) in the recess of the second catching structure (FS2).

After curing, the carrier material (TM) of the colloidal paint (KL) must be sufficiently transparent for the radiation of the color center (FZ) to be used and, if necessary, for the pump radiation of a pump light source. The second trap structure (FS2) is preferably filled with the carrier material (TM) of the colloidal varnish (KL). In the example in FIG. 8, the layer of colloidal lacquer (KL) has been limited photolithographically to the area of the capture structure (FS) and the guide structure (LS). This has the advantage that e.g., electrical contacts of the integrated circuit can preferably be exposed again more easily.

The exemplary device, which is described here for clarification, has a first optical waveguide structure (LWL1), the material of which can be, for example, a sputtered $SiO_2$ material or the material of another transparent oxide that has been applied to the surface of the planar substrate (Sub). Preferably, light emission into other areas of the circuit was previously prevented by a first section of a first metal diaphragm (uMS1) down towards the substrate (Sub). The first optical waveguide structure (LWL1) was preferably structured photolithographically and, for example, covered at the top with a first section of a second metal diaphragm (oMS1). It is recommended to precisely to simulate the workability of such a construction for the process parameters used with an FDTD simulation prior to manufacture, because if the dimensions are too small, light propagation is no longer possible. In the same way, a second optical waveguide structure (LWL2) was manufactured, which is preferably surrounded by a second section of the first metal screen (uMS2) and a second section of the second metal screen (oMS2).

In the example in FIG. 8, an exemplary light source is provided. This consists of an exemplary MESA structure (MS), which is preferred and, for example, isolated from the planar substrate. A light emitting region (LG) is fabricated in this light generating structure. In this context, reference is made to the following document with regard to the production of a light source in indirect semiconductors such as silicon:

Röcke H., Meijer J., Stephan A., Weidenmüller U., Bukow H. H., Rolfs C. "White electroluminescent nanostructure in silicon fabricated using focused ion implantation" Nuclear Instruments and Methods in Physics Research B 181 (1001) pages 274-279

In the example in FIG. 8, such a light source with the light-emitting region (LG) is used to pump the color center (FZ) in the nanoparticle (NP) via the first optical waveguide (LWL1). The color center then emits a characteristic light that is collected by the second optical waveguide (LWL2) and directed to a light-sensitive component (pG, nG) of the microelectronic circuit.

The exemplary photosensitive component (pG, nG) in this illustrative example consists of a PN diode which comprises an N well (nG) and a P cathode (pG).

Numerous light-sensitive microelectronic components are known from the prior art, which can be manufactured in particular with the aforementioned MOS, CMOS, BICMOS and bipolar processes. In order to keep the complexity of the representation low and transparent, FIG. 8 has been simplified to such an extent that a person skilled in the art can recognize which exemplary elements can be combined and how they can be combined and how they can interact. The numerous microfluidic, micromechanical, micro-optical and microelectronic functional elements known from the prior art can also be combined in similar devices using the method proposed here. For example, Bragg filters and mirror structures can be provided in the optical waveguides.

The system thus preferably comprises a microelectronic circuit or at least one microelectronic component, in particular a photodetector and/or a light-emitting component. More specifically, the system preferably comprises a microelectronic MOS, CMOS, BICMOS or bipolar circuit or at least one microelectronic MOS or CMOS or BICMOS or bipolar component, in particular a photodetector and/or a light-emitting component. In the case of CMOS technology, it is preferably a CMOS photodetector, e.g., a CCD pixel or a CCD pixel array and/or a light-emitting CMOS component, a CMOS component being characterized in that it was manufactured using a CMOS technology. The microelectronic circuit is preferably manufactured at least in part using MOS or CMOS or BICMOS or bipolar technology.

The microelectronic circuit preferably also comprises, for example, a voltage regulator for supplying the microelectronic circuit and, if applicable, its subcomponents and/or for supplying a pump light source for exciting the photoluminescence of the color center. However, a suitable micro-optical system must be able to stimulate the color center (FZ) on the one hand and be able to detect the luminescent light of the color center (FZ) and reliably separate it from the light of the pump light source on the other. For this purpose, it makes sense if the micro-electro-optical system has micro-optical components that are micro-technically produced in a corresponding process step. Optical filters and fiber optical light wave guides are particularly important here.

At this point the books Baha E. A. Saleh, Malvin Carl Teich, "Grundlagen der Photonik" (in English: "Fundamentals of Photonics") Wiley-VCH, 2007 and Bernhard C. Kress, Patrick Meyreueis "Applied Digital Optics" Wiley, 2009 are pointed out.

The proposed method thus preferably comprises a step for performing a method for producing micro-optical components on the semiconductor substrate.

Regarding the Co-Integration of Suitable Light Emitting Components

As already indicated, light-emitting components pose a particular problem.

Either a material made of a semiconductor with a direct transition, such as GaAs or another suitable III/V material, is used as the semiconductor substrate, whereby the light-emitting components, which are used to generate the pump light for the excitation of the color center, can be manufactured directly on the wafer, or a material made of a semiconductor with an indirect transition, such as silicon or as a semiconductor substrate Diamond, is used. With regard to the generation of light sources in diamond, reference is made here to the following document:

Burchard B., "Elektronische und optoelektronische Bauelemente und Bauelementstrukturen auf Diamantbasis" (English: "Electronic and optoelectronic components and component structures based on diamonds") Dissertation, Hagen 1994.

With regard to the generation of light sources in silicon, reference should be made to the following magazine article, which has already been mentioned:

Röcken H., Meijer J., Stephan A., Weidenmüller U., Bukow H. H., Rolfs C., "White electroluminescent nanostructure in silicon fabricated using focused ion implantation" Nuclear Instruments and Methods in Physics Research B 181 (1001) pages 274-279.

It discusses a PNP or NPN-MESA structure in which the average doping is extremely high and very narrow. The authors take the view that this is a component in the avalanche breakdown. The light energy is emitted by the hot electrons in the form of a thermal spectrum. In the case of an NPN structure, the microelectronic circuit applies a very high voltage between the contact of the first N-area and the contact of the second N-area. There is a breakthrough. The breakdown of the base collector diode injects a current into the base. The extremely highly doped and very narrow base becomes conductive so that the transistor suddenly and extremely quickly switches on. The parts of the base-collector capacitance near the PN junction are suddenly discharged. This leads to an electromagnetic wave in the base, which is focused by the high doping and the resulting refractive index jump. If a "+" is to symbolize high doping, the use of a $PN^+P$ structure or an $NP^+N$ structure is suggested here. In particular, so-called silicon avalanche-based light-emitting diodes are known from the literature, which do similar things. (K. Kurokawa, "Avalanche Breakdown Electroluminescence in Silicon Carbide Light Emitting Diodes", January 2000 Materials Science Forum 338-342: 691-694, DOI: 10.4028/www.scientific.net/MSF.338-342.691)

On the basis of such a PN$^+$P structure or an NP$^+$N structure or such a silicon avalanche-based light-emitting diode, a quantum technological, micro-electro-optical or photonic or micro-electronic system in MOS, CMOS, BIC-MOS or bipolar technology, or another suitable wafer manufacturing technology. Said system then comprises a substrate (sub), which can be manufactured in particular from an indirect semiconductor such as silicon and has a surface (OF). The substrate (sub) preferably has a silicon avalanche-based light-emitting diode or a PN$^+$P structure or an NP$^+$N structure or a semiconducting MESA structure (MESA) for generating light. These silicon avalanche-based light-emitting diodes, PN$^+$P structures, NP$^+$N structures or semiconducting MESA structures (MESA) serve as a light-emitting microelectronic component that can be used, for example, as a pump light source for a color center. The MESA structure is preferably insulated from the substrate and has a first area (E) of the MESA structure (MESA), a second area (B) of the MESA structure (MESA) and a third area (C) of the MESA structure (MESA). The quantum technological, micro-electro-optical or photonic or micro-electronic system has at least one, preferably several nanoparticles (NP) with at least one, but preferably a variety of preferably equal color centers (FZ).

At least one micro-optical functional element, in particular an optical waveguide (LWL2) which is manufactured in the substrate (Sub) or on the surface (OF) of the substrate (Sub), preferably couples the said light-emitting components in or on the substrate (Sub) with one or more color centers, so that they can be pumped or otherwise optically manipulated. For the purposes of this document, the substrate (sub) then comprises the micro-optical functional element (LWL2). In this case, the optical waveguide is wholly or in large portions connected firmly to the substrate in its longitudinal extension. The first area (E) and the third area (C) of the MESA structure that may be used preferably have a first conductivity type. The second area (B) of the possibly used MESA structure preferably has a second conductivity type which is different from the first conductivity type and the second area (B) is arranged between the first area (E) and the second area (C). The MESA structure (MESA) is preferably a PNP or NPN MESA structure, the width of the second area (B) preferably being smaller than 3 µm and/or smaller than 1 µm and/or less than 500 nm and/or smaller than 200 nm and/or smaller than 100 nm and/or smaller than 50 nm and/or smaller than 25 nm and/or smaller than 10 nm. If the doping is sufficiently high, the second region (B) is then suitable for emitting light when a sufficiently high electrical voltage is applied. A coupling with an optical functional element then documents that the MESA structure is intended to emit light. The light emitted by the second area (B) then interacts with a color center (FZ) of the nanoparticle (NP) by means of said micro-optical functional element (LWL2).

Another possibility is to manufacture the light sources as nanoscopic LEDs, for example, and to place them in separate work steps such as nanoparticles (NP). In the document presented here, such very small light-emitting diodes or PN junctions (LEDs) are therefore expressly included if their crystallites have a suitably small dimension after these components have been separated from the wafer assembly.

Such LEDs are referred to below as nanoscopic LEDs or nano-LEDs.

These nano-LEDs are thus nanoparticles (NP), preferably nanocrystals, with a particle size smaller than 1 µm and/or better smaller than 500 nm and/or better smaller than 250 nm and/or better smaller than 100 nm and/or better smaller than 50 nm and/or better smaller than 25 nm and/or better smaller than 10 nm and/or better smaller than 5 nm and/or better smaller than 2.5 nm and/or smaller than 1 nm. Thus, in the ideal case, one can rather speak of LED dust. It was recognized that LED dust is particularly suitable for the construction of photonic systems.

It is therefore proposed, in one variant of the method, to carry out a method for assembly of light-emitting components on the semiconductor substrate, whereas the placement of nanoscopic LEDs by means of a colloidal lacquer (KL), which includes such nanoscopic LEDs as particles, is also such a manufacturing step. During the manufacturing process, the colloidal lacquer (KL) is converted into a colloidal film (FM) that fixes the nano-LEDs.

The planar substrate (sub) is preferably a semiconductor substrate or a silicon wafer or a GaAs wafer or a wafer made from a III/V material or a wafer made from II/VI material or from a wafer treated by means of band gap engineering or a diamond wafer or a Ge wafer or another wafer made of a mixed semiconductor or a part of such a wafer.

In this disclosure, a quantum technological, micro-electro-optical or photonic system is therefore proposed which comprises a planar substrate (sub), in particular a semiconductor substrate. What is special about the proposal here is that the entire system, with the exception of the nanoparticle, can be made of an indirect semiconductor material. A microelectronic circuit, preferably using MOS, CMOS, BICMOS, or bipolar technology, is typically manufactured in and/or on the semiconductor material. The microelectronic circuit here preferably comprises a plurality of components such as transistors, diodes, resistors, capacitors, light-sensitive and possibly light-emitting electronic components.

Such a light-sensitive component of the said microelectronic Circuit, for example, to detect a fluorescence of the color center of the nanoparticle (NP), which is preferably a diamond with an NV center, can for example be a PN diode as a light-sensitive electrical component (nG, pG) that is part of the micro-electrical circuit. A light-emitting component can, for example, be a MESA structure, as described here. The quantum technological, micro-electro-optical or photonic system preferably comprises a partial area of a colloidal film (FM) or colloidal lacquer (KL), which has at least one nanoparticle (NP) with a color center (FS). (See FIG. 8). It can be useful if the quantum technological, micro-electro-optical or photonic system preferably comprises at least a partial area of a colloidal film (FM) or colloidal lacquer (KL) with one or more nanoparticles that are ferromagnetic or have a ferromagnetic partial device and, if necessary, that can interact with the color center of the nanoparticle (NP) by means of their magnetic field. One or more subregions of the optionally several colloidal films (FM) are preferably produced by means of one of the methods described above. In a preferred variant, the nanoparticles (NP) are diamond nanocrystals with a crystal size smaller than 1 µm and/or better smaller 500 nm and/or better smaller 250 nm and/or better smaller 100 nm and/or better smaller 50 nm and/or better smaller 25 nm and/or better smaller 10 nm and/or better smaller 5 nm and/or better smaller 2.5 nm and/or better smaller 1 nm. The color center is preferably an NV center in a diamond nanocrystal or an SiV center in a diamond nanocrystal or an H3 center in a diamond nanocrystal.

A variant is particularly preferred in which the planar substrate (sub) or the semiconductor substrate is a microelectronic circuit, in particular a microelectronic circuit in MOS, CMOS, BICMOS, or bipolar technology. Such a microelectronic circuit, which is typically manufactured in the planar substrate (sub), preferably comprises a plurality of microelectronic components, such as MOS transistors, bipolar transistors, diodes, resistors, capacitors, coils and possibly others Semiconductor components that are manufactured in the planar substrate, in particular in the metallization stack, and are connected by wires to the microelectronic circuit that is optically coupled to the color center (=the paramagnetic center) of the nanoparticle, which is preferably a diamond with a color center, to form an overall system.

The planar substrate (sub) preferably comprises at least one micro-optical functional element, e.g. one Optical fiber (LWL1), the microelectronic circuit in MOS, CMOS, BICMOS, or bipolar technology. Typically, the planar substrate (sub) also comprises the photosensitive electrical component (nG, pG) in order to preferably detect a luminescence of the color center (FZ) by means of this light-sensitive electrical component (pG, nG). At least one operating parameter of the microelectronic circuit, for example the value of a control signal within the microelectronic circuit, then typically depends on a value of the intensity of the fluorescence of the color center (FZ) detected by the light-sensitive component (pG, nG). The color center (FZ) is preferably coupled to the light-sensitive electrical component (pG, nG) via the micro-optical functional element (LWL1). Such a quantum technological, micro-electro-optical or photonic or micro-electronic system can, however, also be based on a planar substrate (Sub) made of a direct semiconductor material. This has the advantage that the light yield of the light-emitting components of the system is higher and thus better pump power can be achieved, which increases the contrast between the intensity of the fluorescence of the color center at the magnetic flux density with the maximum fluorescence intensity of the color center and the intensity of fluorescence of the color center in the magnetic flux density with the minimum fluorescence intensity of the color center.

Preferably then substrate materials of the planar substrate (Sub) are used, in which a semiconductor material of the substrate can be a III/V semiconductor material and/or an II/VI semiconductor material or a semiconductor material produced by bandgap engineering. The substrate material explicitly does not need to be homogeneous but can consist of different materials. The system then comprises a microelectronic circuit that is part of the substrate (Sub), and an electrical component that is part of the micro-electric circuit, and a micro-optical subdevice (LWL1, LWL2) that is part of the substrate (Sub), and one or multiple nanoparticles (NP), which can be diamonds, with one or multiple color centers (FZ), which can each be one or multiple NV centers in the diamond or in the diamonds. The planar substrate (sub) thus comprises the microelectronic circuit and the electrical component and the micro-optical device (LWL1, LWL2). The special feature of the system is that it has at least one light-emitting electro-optical component (MS) that is part of the substrate (Sub) or is manufactured on the surface of the substrate (Sub), whereas the planar substrate (Sub) comprises the light-emitting component (MS) and wherein the light-emitting electro-optical component (MS) interacts optically with the micro-optical sub-device (LWL1, LWL2). The light-emitting electro-optical component (MS) interacts with the electrical component electrically and/or optically in a direct or indirect manner by means of the micro-optical sub-device (LWL1, LWL2). This interaction between the light-emitting electro-optical Component (MS) with the electrical component takes place with interaction with the color center (FZ) or with a plurality of color centers of the color centers (FZ).

The planar substrate (sub) is therefore preferably a semiconductor substrate, a silicon wafer or a GaAs wafer or a wafer made from a III/V material or a wafer made from II/VI material or a wafer, that has been treated by means of band-gap engineering, or a diamond wafer or a Ge wafer or another wafer made from a mixed semiconductor.

In the case of III/V materials, the substrate can also comprise an LED or a laser.

The quantum technological, micro-electro-optical or photonic system preferably comprises at least one micro-optical element. Preferably, the micro-optical element is suitable or intended to fulfill at least the function of one of the following micro-optical elements:
- the function of an optical lens and/or
- the function of a photonic crystal and/or
- the function of an optical filter and/or
- the function of an optical fully or partially reflecting mirror and/or
- the function of a fiber optic light wave guide (LWL1, LWL2) and/or
- the function of a directional coupler and/or
- the function of a wave sump (termination) and/or
- the function of a circulator and/or
- the function of a coupling and/or decoupling element.

Color centers (FZ) usually interact with magnetic fields. It is therefore useful if the device comprises at least one functional element of a magnetic circuit and/or one ferromagnetic sub-device or a ferromagnetic sub-structure. Whereas this can be a microscopic or nanoscopic permanent magnet, which is optionally integrated, for example, into the metallization stack of the said MOS, CMOS, BICMOS or bipolar circuit. Said ferromagnetic sub-device or sub-structure is preferably part of a magnetic circuit. In this case, the quantum technological, micro-electro-optical system preferably features an excitation device, for example a flat coil produced in the metallization stack, which is suitable to evoke a magnetic excitation in the magnetic circuit. The magnetic part device is preferably manufactured by depositing a ferromagnetic layer and subsequent photolithographic structuring.

If the color center (FZ) is to be used as a partial device of a sensor system, the amount and/or the direction of the magnetic excitation H generated by the excitation device in the magnetic circuit preferably depends on an operating state parameter of the electronic circuit, i.e. preferably the MOS, CMOS, BICMOS or bipolar circuit. In this context, reference is made to the German patent application DE 10 2018 127 394 A1, which was still unpublished at the time of the priority application of this disclosure.

The use of the method presented here for producing a device according to DE 10 2018 127 394 A1 is expressly part of this disclosure. The core of the document presented here is concerned with the large-scale series production of such systems, as described, for example, in DE 10 2018 127 394 A1. The methods presented here will also be suitable for the production of quantum computers and other quantum optical systems that require a connection to microelectronic and/or micromechanical and/or micro-optical systems.

Such a quantum technological, micro-electro-optical system typically comprises a light-sensitive component (pG, nG). The light-sensitive component (pG, nG) is then preferably suitable and/or intended to detect a luminescence of the color center (FZ). If a system according to the said German patent application DE 10 2018 127 394 A1, which was unpublished at the time of priority notification of this disclosure, is constructed for example, at least one operating parameter of the microelectronic circuit typically depends on a value of the luminescence of the color center (FZ) detected by the light-sensitive component (pG, nG)). The color center (FZ) is preferably coupled on through various optical elements on the one hand with a pump light source (MS) via an optical wave connection comprising several optical components (NP, KL, LWL2) and on the other hand with the light-sensitive component (pG, nG) via a further optical wave connection comprising several further optical components (NP, KL, LWL1). The integrated MOS circuit or CMOS circuit or BICMOS circuit or circuit in bipolar technology or another circuit technology disclosed here is thus characterized in that it comprises at least one crystalline sub-device, which is preferably mechanically and firmly connected to it and which comprises a color center (FZ), whereas the color center (FZ) acts as a functional element for the intended use of the integrated circuit. A colloidal film (FM) and/or a colloidal varnish (KL) preferably establish the mechanical connection between the crystalline part device and the planar substrate (Sub). Preferably one or more optical couplings e.g., through one or more micro-optical functional elements create one or more interactive connections between the color center (FZ) and at least one or more parts of the MOS, CMOS, BICMOS or bipolar circuit, in particular light-emitting areas (LG) and/or light-sensitive components (pG, nG). The integrated CMOS circuit or MOS circuit or BICMOS circuit or circuit in bipolar technology or another circuit technology typically has one or more transistors. In the case of a BICMOS circuit, these can be bipolar transistors and/or MOS transistors. In the case of a MOS or CMOS circuit, these can be MOS transistors. In the case of a bipolar circuit, these can be bipolar transistors.

Printing of the Colloidal Varnish (KL)

In addition to the method of lacquering the planar substrate (Sub) using a spin coater (SC) or spraying and/or brushing and/or local wetting, another important method is the method of printing on the planar substrate (Sub) with the colloidal lacquer (KL), which comprises the nanoparticles (NP). The nanoparticles (NP) preferably comprise said color centers (FZ) and/or other functional elements. This has the advantage that this print of the colloidal varnish can be immediately performed in a structured way. In this case, the production of the guide structures (LS) and the production of the capture structures (FS) on the planar substrate (sub) may be dispensed, if necessary. A wide variety of methods known from printing technology can be used for this.

The following printing principles come into consideration for this:

Scheme Surface Against Surface

A distinction is made between three printing principles:
Printing surface with pre-structured colloidal varnish (KL) against the surface of the planar substrate (Sub) (flat versus flat). A micromechanically structured stamp is particularly suitable here.
Printing cylinder with colloidal varnish (KL) against the surface of the planar substrate (Sub) (round against flat)
Print Surface Against Planar Substrate (Sub)
With this principle, the planar substrate (sub) to be printed is made from a flat one counter pressure plate (platen) on a flat, coated with the colloidal varnish (KL) printing form plate, which, as already mentioned, can be micro-structured and can comprise microfluidic elements in particular for guiding the colloidal varnish. Colloidal lacquer (KL) is transferred to the planar substrate (sub) to be printed. The disadvantages of the principle are the forces required for larger areas and the limited speed. Since the planar substrate (sub) is usually a semiconductor wafer, it is very brittle, which usually requires a very homogeneous force distribution during printing. It is therefore advisable to mount the printing plate hydraulically or similarly.

Print Cylinder Against Planar Substrate (Sub)

With the principle of round versus flat, the contact pressure on the planar substrate (sub) to be printed occurs through the rotary movement of the printing cylinder over the printing plate. The printing cylinder rotates around its axis in a fixed bearing, while the planar substrate (sub) is moved synchronously under it during each printing process (printing process). As a result, the contact pressure is only effective within a narrow stripe, namely the "tangential" contact area between the round cylinder and the flat printing plate. This is typically not practicable with brittle planar substrates (sub). Therefore, rubber rollers or the like will be used in these cases, which limits the resolution of the structure of the colloidal varnish (KL) on the substrate (Sub). This enables higher printing speeds and larger formats.

The application of a cylinder versus cylinder principle would require a cylindrical or flexible planar substrate (sub), which is included in the claimed scope of this text but is actually impractical.

In the indirect printing process, the print image of the colloidal varnish (KL) can first be applied to an intermediate carrier. The intermediate carrier is flexible and transfers the colloidal varnish (KL) to the planar substrate (Sub) to be printed on. For this reason, the printed image must be right-sided when using an indirect printing process. Examples of an indirect printing process are offset printing, letterset printing and pad printing. The latter in particular is particularly suitable for the intended application since the forces are distributed homogeneously over the planar substrate (sub) when used correctly.

Printing processes are based on the relationship between the printing elements and the printing plate, such as flat, letterpress, gravure and through printing. According to this feature, the printing processes are also differentiated in DIN 16500 into the main printing processes:

Letterpress: image areas of the printing plate are higher than non-image areas, e.g. letterpress and flexographic printing, Flat printing (see also lithography): image areas and non-image areas of the printing plate are approximately on the same level, for example in offset printing Gravure printing: image areas of the printing plate are lower than non-image areas Through printing: Image areas of the printing plate consist of the openings of a stencil mostly on a color-permeable stencil carrier, a screen made of plastic or metal wires. Non-image areas are impermeable to paint, for example screen printing and risography.

Furthermore, a distinction can be made according to the transmission path: For the application when printing the colloidal varnish, we differentiate between direct and indirect printing processes. Direct printing processes are characterized by the fact that the print image is brought directly from the printing plate onto the planar substrate (sub) to be printed. Therefore, the print image must be reverse imaged on the printing plate. Examples of a direct printing process are squeegee gravure printing, letterpress and flexographic printing. In the indirect printing process, the print image is first applied to an intermediate carrier. The intermediate carrier is flexible and transfers the paint to the substrate. Thus, because of the application of force, indirect methods are particularly suitable for the application of structures made of colloidal lacquer on a planar substrate (sub). For this reason, the printed image must be the laterally correct image in an indirect printing process. Examples of an indirect printing process are offset printing and pad printing, which is particularly recommended here.

Letterpress Printing

In the case of letterpress printing, the printing elements protrude from the printing plate. When using letterpress printing for printing the colloidal varnish (KL), the usage of a micro-structured printing plate is particularly preferred.

For example, for printing to a MOS wafer or CMOS wafer or BICMOS wafer or bipolar wafer planarized on the surface by means of CMP and acting as the planar substrate (sub) it is meaningful to use a micro-structured wafer as the opposite printing plate, raised ridges of the micro-structured wafer represent the pressure elements.

A device for applying the colloidal varnish (KL) in the form of a platen press is particularly suitable. In this case, the printing is flat/flat, as the flat pressure surface of the platen is pressed against the flat printing plate, which is usually clamped vertically in the platen printing machine. As long as an absolutely uniform pressure distribution is achieved on the planar substrate, such a platen press is therefore suitable for the use of the letterpress printing method. In the case of platen pressing, the planar substrate is preferably fed in wafer form, for example as a MOS wafer or CMOS wafer or BICMOS wafer or bipolar wafer.

From this basic form of letterpress, further printing forms can be developed:

Indirect Printing

This is indirect letterpress printing, in which the artwork is printed from a cliché that is the right way round. The letterpress cliché transfers the print image to a rubber blanket, the so-called rubber cylinder, which creates the reversed image that is printed by the rubber blanket onto the planar substrate (sub) (paper) to be printed.

Flexographic Printing

Flexographic printing is known from letterpress printing. Flexographic printing is a newer letterpress printing process in which the printing plate consists of a flexible photopolymer plate, which in the present case is preferably micro-structured. The efficiency in flexographic printing can be considerably improved by using prefabricated continuous printing plates. These are specially developed plastics adapted to the intended use, for example polyimide layers on a carrier material (sleeve), for example a silicon wafer. The structures to be transferred can, for example, be engraved into the surface using a $CO_2$ laser or excimer laser. This process is also called flexo direct engraving. In this case, a coated silicon wafer is preferably used for such a flexographic direct engraving and serves as a sleeve.

Gravure Printing

Gravure printing is a printing process in which the printing elements are transferred to the printing plate by chemical or mechanical processes. The depressions are preferably produced by means of microtechnological processes. During the printing process, the printing plate is painted with a relatively thin liquid colloidal lacquer and the excess paint including the excess nanocrystalline nanoparticles (NP) in the colloidal lacquer (KL) is stripped off the printing plate with a squeegee. When using diamond particles as nanocrystalline nanoparticles (NP), this is not without problems, as a damage of the printing plate by the diamond nanoparticles might occur.

The colloidal varnish (KL) for the printing process preferably remains only in the recessed areas of the printing form; so only these parts print. The transfer of the color to the planar substrate takes place by means of high contact pressure, which must therefore have a certain flexibility. This method is therefore less suitable for printing MOS wafers or CMOS wafers or BICMOS wafers or bipolar wafers. The amount of varnish applied for a structuring area is determined by the depth of the depressions on the printing plate between the raised structures. A vertical structuring of the printed structures produced is thus also possible in this way.

Planographic Printing

With planographic printing, the printing and non-printing areas are on the same level. For this purpose, hydrophobic and hydrophilic areas are preferably generated on the printing form by a suitable one surface treatment. For this it is necessary that the selected carrier material can be dissolved in a solvent (LM), here for example water. This is the case with gelatin. While the printing parts accept the solvent of the carrier, e.g. water, the non-printing areas are coated with a grease film or conditioned accordingly by a plasma treatment and subsequently repel the printing ink, which is water-based here. The printing parts will take on the colloidal varnish (KL). The non-printing areas, however, do not accept the colloidal varnish and repel the colloidal varnish in the printing process.

Screen Printing

Another printing process that is particularly suitable is the screen-printing process. Screen printing is particularly important for the technical teaching presented here, in which the colloidal varnish (KL) is pressed with a wiper-like tool, preferably a rubber squeegee, through a fine-meshed textile fabric or a template onto the planar substrate (sub) to be printed. The printing plate of the screen printing consists of a frame that is covered with a fabric made of metal or plastic. The fabric carries a stencil made of plastic or metal, for the production of which the entire surface of the tensioned fabric is coated with a photopolymer and exposed to the motif to be printed via a positive film. The photopolymer hardens in the non-printing areas and the unexposed material is washed out. During the printing process, the printing ink only passes through the fabric where it has been washed free. A silicon wafer perforated by micro-structuring can also be used as a printing stencil.

Compared to other printing methods, the printing speed is relatively slow. Screen printing is a direct printing process. During the printing process, there is a small gap of a few µm to a few millimeters between the printing plate and the planar substrate (sub), which is necessary to enable the so-called jump (German Absprung). This gap should ideally be 0m, but this cannot usually be achieved. This screen jump height is locally and temporarily canceled where the squeegee presses the screen down so far that the stencil rests on the printing material. At this point, the contours are sealed and the colloidal varnish is transferred to the planar substrate (sub). If the squeegee continues to move, the fabric that has just been coated with the stencil is raised again.

In the case of printing stencils without a supporting screen, the stencil itself must be sufficiently stable and made of steel or silicon, for example, and stretched directly into the frame. As with the stencil, the possible print images are limited. A clogging of meshes with components of the printing paste—as is possible with the otherwise almost identical screen-printing process—cannot occur. Therefore, stencil printing is more suitable for applying the colloidal varnish (KL) to the planar substrate (Sub). The use of microstructured printing stencils is particularly advantageous. For example, wafers perforated using microstructure technology can be used as printing stencils.

Pad Printing

Pad printing is an indirect squeegee gravure printing and is also particularly suitable for applying the colloidal varnish to the planar substrate (sub). The template is transferred from a surface (gravure printing plate) onto the planar substrate (sub) using a pad (tampon), for example made of porous silicone rubber. It can thus also be applied to uneven planar substrates, for example non-planarized silicon wafers with electronic structures and/or micro-optical and/or already formed microfluidic functional elements. This is of particular advantage since the pad printing can thus be used to place the nanocrystalline nanoparticles (NP) in the microfluidic functional elements (FS2).

Stamp Printing

Stamp printing is a flexographic printing process and as such can be assigned to letterpress printing. The stamp is preferably made elastic.

Electronic Printing Methods

It is conceivable to apply the colloidal lacquer by means of an inkjet print or a suitable dispenser with x-y coordinate control.

Printable quantum technological components then result. One such printable quantum electronic component comprises a planar substrate (Sub) and a structured colloidal film (FM) as a result of the printing process. In the application example discussed here, this can be a structured gelatin film which comprises diamond nanocrystals with NV color centers. The colloidal film (FM), which is created through the structuring and hardening of the colloidal varnish (KL), thus includes nanoparticles (NP) as an essential feature. At least some of the nanoparticles (NP) or all of the nanoparticles (NP) preferably have one or more color centers. For the purposes of this document, however, the nanoparticles (NP) can also be nano-LEDs. The structured colloidal film (FM) is preferably printed on the planar substrate (Sub). Other electrical and/or photonic functional elements are preferably also printed or manufactured on the substrate (sub). These other electrical and/or photonic functional elements that are printed or manufactured on the substrate (sub) are preferably one or more of the following functional elements:
- an electrical line,
- an electrical inductance,
- an electrical capacitance,
- an electrical resistance,
- a transistor,
- a diode,
- a light wave guide,
- a wave coupler,
- an optical resonator,
- a mirror,
- a lens, etc.

Clear varnishes and/or semiconducting varnishes and/or electrically more or less conductive and non-conductive varnishes can be used for printing these components.

In this way, a complete quantum technological system can be created on the planar substrate.

This corresponds to a printing process for the placement of nanoparticles (NP), for example in the form of nanocrystals with color centers (FZ) on the planar substrate (Sub). This is again a process for producing a quantum technological, micro-electro-optical or micro-electronic or photonic or micro-optical system. The method begins again with the deployment of a planar substrate (Sub). The substrate is again, for example, a silicon wafer and/or a wafer made of a different material and/or a differently suitable material that can be printed in the following process. It is preferably a semiconductor wafer and/or another semiconductor substrate or a silicon wafer or a GaAs wafer or a wafer made of IV material or a wafer made of III/V material or a wafer made of II/VI-Material or a wafer made from mixtures of such materials or a germanium wafer or a mono- or polycrystalline diamond wafer or a part thereof or around a glass wafer and/or a ceramic wafer and/or a metal sheet or a plastic plate or a Part of the same. The method preferably comprises the production of a typically integrated circuit at a point in time in the method. However, the circuit can also consist of discrete components that are attached to the substrate. As a result of this manufacturing step, the planar substrate (Sub) then comprises at least one electronic circuit made of at least two electrical components at the end of the method, which are located mechanically fixed on the planar substrate (Sub) or are located in the planar substrate (Sub). This circuit preferably comprises at least one MOS transistor and/or one bipolar transistor. In this sense, an electrical line is an electrical component, so that a circuit might comprise an electrical line and a second component, for example a resistor or a transistor. The printing process, like the spin coating process that was explained above, comprises the provision of a colloidal lacquer (KL) in the form of a colloidal solution of nanoparticles (ND) in a carrier (TM) and possibly a solvent (LM). As before, at least some of the nanoparticles (NP) or all of the nanoparticles (NP) preferably comprise one or more color centers (FZ). The nanoparticles (NP) can also be nano-LEDs. What has been written above regarding this point also applies here in an analogous manner. The colloidal solution, the colloidal varnish (KL), is mixed together in such a way that it can wet at least parts of the planar substrate (sub). Now, however, structured printing or lacquering or coating or local wetting of the planar substrate (Sub) with the colloidal solution, the colloidal lacquer (KL), is preferably carried out in order to create a structured colloidal film (FM) on a surface (OF) of the planar substrate (Sub). In this case, for example, pad printing and/or stencil printing and/or screen printing and/or nano-imprint printing methods can be used as printing methods. The person skilled in the art will certainly be able to identify further methods which are suitable for printing from the large number of methods known in the prior art.

Although it is conceivable to further structure the structured colloidal film (FM) applied by means of these printing techniques using photolithographic methods, we assume here that the printing method is sufficient here. However, it will be easy for the person skilled in the art to further refine the method by means of an additional structuring step. On the assumption that such a further structuring step is typically not actually necessary here, the hardening of the colloidal film (FM) now follows.

Again, the nanoparticles (NP) are preferably particles with a particle size of less than 1 µm and/or better less than 500 nm and/or better less than 250 nm and/or better less 100 nm and/or better less 50 nm and/or better less 25 nm and/or better less 10 nm and/or better less 5 nm and/or better less 2.5 nm and/or better less 1 nm.

Likewise, the nanoparticles (NP) are again diamond nanocrystals with a crystal size smaller than 1 µm and/or better smaller 500 nm and/or better smaller 250 nm and/or smaller, better 100 nm and/or better smaller 50 nm and/or better smaller 25 nm and/or better smaller 10 nm and/or better smaller 5 nm and/or better smaller 2.5 nm and/or better smaller 1 nm. Furthermore, the nanoparticles (NP) can be silicon nanocrystals with a crystal size smaller than 1 μm and/or better smaller than 500 nm and/or better smaller than 250 nm and/or better smaller 100 nm and/or better smaller 50 nm and/or better smaller 25 nm and/or better smaller 10 nm and/or better smaller 5 nm and/or better smaller 2.5 nm and/or better smaller 1 nm.

The nanoparticles (NP) can also be nanocrystals from a direct semiconductor material with a crystal size of less than 1 μm and/or better less than 500 nm and/or better less than 250 nm and/or better less than 100 nm and/or better less than 50 nm and/or better less than 25 nm and/or better less than 10 nm and/or better less than 5 nm and/or better be less than 2.5 nm and/or better be less than 1 nm.

The nanoparticles can also be nanocrystals made of an III/V or II/VI semiconductor material or a mixture of the same with a crystal size of less than 1 μm and/or better less than 500 nm and/or better less than 250 nm and/or better less than 100 nm and/or better less than 50 nm and/or better less than 25 nm and/or better less than 10 nm and/or better less than 5 nm and/or better less than 2.5 nm and/or better less than 1 nm.

The nanoparticles (NP) can also be nanocrystals with a crystal size of less than 1 μm and/or better less than 500 nm and/or better less than 250 nm and/or better less than 100 nm and/or better less than 50 nm and/or better less than 25 nm and/or better less than 10 nm and/or better less than 5 nm and/or better less than 2.5 nm and/or better less than 1 nm.

Finally, the nanoparticles (NP) can be nano-LEDs with a crystal size of less than 1 μm and/or better less than 500 nm and/or better less than 250 nm and/or better less than 100 nm and/or better less than 50 nm and/or better less than 25 nm and/or better less than 10 nm and/or better less than 5 nm and/or better less than 2.5 nm and/or better less than 1 nm.

A color center of the color centers can be, for example, an NV center in a diamond crystal and/or an SiV center in a diamond crystal and/or an H3 center in a diamond crystal.

It may be useful if microfluidic functional elements (LS, FS, FS1, FS2) in the surface of the planar substrate (Sub) control the flow of colloidal varnish (KL) during the printing process. For this purpose, the performing of a procedure to manufacture of microfluidic functional elements on the planar substrate (sub) is meaningful. For example, ridges and trenches, etc. might be manufactured for the purpose of influencing the paint flow.

Some of the microfluidic functional elements (LS, FS, FS1, FS2) are therefore preferably provided and/or suitable to form a structured colloidal film (FM) on a surface (OF) of the planar substrate (Sub) and to enter into mechanical or fluid mechanical interaction with one or, if necessary, several of the nanoparticles (NP) while the planar substrate is being printed with the colloidal lacquer (KL).

This publication is devoted to the topic of how a NV center-based quantum technology can be combined with MOS, CMOS, BICMOS or bipolar technology without having to modify the semiconductor process concerned. Therefore, an essential criterion for the substrate (sub) is that, apart from oxides and mentalizations etc., it is at least partially electrically semiconducting.

The planar substrate (sub) therefore preferably comprises a semiconductor wafer and/or semiconductor substrate and/or a silicon wafer and/or a GaAs wafer and/or a wafer made of IV material and/or III/V material and/or from II/VI material and/or from mixtures of such materials and/or a germanium wafer and/or a mono- or polycrystalline diamond wafer and/or a glass wafer and/or a ceramic wafer and/or a metal sheet and/or a plastic plate. It is namely also conceivable to build quantum technological systems on the last three substrates mentioned.

If the planar substrate (sub) is a semiconductor substrate, it makes sense in the sense of co-integration, to carry out a method for producing electronic components on the semiconductor substrate and/or for producing electronic MOS, CMOS, BICMOS or bipolar components on the semiconductor substrate preferably before printing and/or lacquering and/or coating and/or local wetting with the colloidal varnish (KL).

It is also sensible to carry out a method for producing micro-optical functional elements on the semiconductor substrate as part of the overall production process. These micro-optical functional elements preferably serve the purpose of directing the light from the pump light sources onto the color centers and on the other hand to collect the fluorescent light of the color centers and to feed it over suitable light paths, for example optical waveguides (LWL1, LWL2) and filters, for example Bragg filters, to the photodetectors (pG, nG).

As already described, in addition to the possible function of the possibly necessary supply of fluids to be measured in later operation, it is the preferred function of some microfluidic functional elements to influence the flow of the colloidal paint (KL) and thus the movement of the nanoparticles (NP) during the printing and/or during the lacquering and/or coating. One of the functions can be to increase the probability that a nanoparticle (NP) will be located in a predetermined area (e.g. FS2 in FIG. 8) relative to a micro-optical element (e.g. LWL1 and LWL2 in FIG. 8) after the end of the printing process and/or varnishing process and/or coating process. This is the only way to ensure that an interaction between the micro-optical element (LWL1, LWL2) and the color center (FZ) of the nanoparticle (FZ) is guaranteed. It is therefore important typically one microfluidic functional element (LS, FS1, FS2) is functionally related to at least one micro-optical functional element (LWL1, LWL2), which was also manufactured using this method. In this example, the functional relationship results only based on the synopsis of the control of the placement with the achieved optical coupling of the color center (FZ) with the micro-optical element (LWL1, LWL2). If everything is correctly dimensioned, the relevant micro-optical functional element (LWL1, LWL2) is optically in interaction with at least the relevant color center (FZ) of the relevant nanoparticle (NP)—here the nanoparticle trapped in the microfluidic functional element (FS2) with its color center (FZ)—. This can mean, for example, that the microfluidic functional element (FS2) picks up a nanodiamond as a nanoparticle (NP) with an NV color center as the color center (FZ) in a recess and enforces such an optical coupling between nanodiamonds and optical waveguide (LWL1, LWL2) as a result of the forced positioning of the color center (FZ) in relation to an optical functional element, for example a coupling structure for an optical waveguide (LWL1, LWL2). Such a micro-optical functional element— here the optical waveguide (LWL1, LWL2) as an example— is then suitable and/or provided, to interact optically with at least the relevant color center (FZ) of the relevant nanoparticle (NP)—here the one in the microfluidic functional element (FS2) trapped nanocrystal with its color center (FZ)—. The nanoparticle (NP) is preferably a nanodiamond crystal with an NV Center or around a nano-LED, the active layer of which can then be coupled with the said optical waveguide (LWL1) as an example.

The actual function of the relevant microfluidic component (FS2) is then to increase the probability in this example that, for example, a color center (FZ) of a nanocrystal can interact with a micro-optical component (LWL1, LWL2). In order to be able to manufacture a complete optical system, it is useful to carry out a printing process to produce light-emitting devices on the semiconductor substrate. Reference has already been made to the Rocken procedure. Such a production can also provide for the printing or application of a colloidal varnish (KL) with NANO LEDs as nanoparticles (NP).

In general, it can be stated here that in the technical teaching disclosed here, a MOS, CMOS, BICMOS and bipolar circuit with nanocrystals as nanoparticles (NP) with color centers (FZ) with regard to production and the interaction of the nanoparticles (NP) with components of the MOS, CMOS, BICMOS, or bipolar circuit was disclosed.

Such a quantum technological and/or micro-electro-optical and/or microelectronic and/or photonic system preferably comprises a semiconductor crystal as a planar substrate (sub) and a further crystal, preferably in the form of a nanoparticle (NP) in the form of a nanocrystal, whereas the semiconductor crystal, thus the planar substrate (Sub), comprises a MOS circuit or a CMOS circuit, a BICMOS circuit or a bipolar circuit or another microelectronic circuit and wherein the further crystal has at least one color center (FZ) and the further crystal is mechanically preferably directly connected to the semiconductor crystal, that is to say the planar substrate (Sub), in particular by a colloidal film (FM) and/or a colloidal lacquer (KL). The further crystal is thus mechanically attached to the semiconductor crystal, that is to say the planar substrate (Sub), in particular by the said colloidal film (FM) and/or the said colloidal lacquer (KL). The special thing is that there is an operative connection between the color center (FZ) of the further crystal and at least a part of the MOS circuit, the CMOS circuit, the BICMOS circuit or the bipolar circuit or other microelectronic circuit of the semiconductor crystal, i.e. the planar substrate (Sub). How this can be manufactured has been explained above.

The further crystal is preferably a diamond crystal or a silicon crystal. The further crystal is preferably a diamond crystal and the at least one color center (FZ) is an NV color center and/or an H3 center or the further crystal is a diamond crystal and the at least one color center (FZ) is a SiV color center. The MOS circuit, the CMOS circuit, the BICMOS circuit, the bipolar circuit or another microelectronic circuit of the semiconductor crystal (sub) preferably comprises a light-sensitive component (nG, pG), for example a photodiode, which can interact, for example, with the color center (FZ) of the further crystal and/or a light-emitting component, such as the MESA structure (MS) described above by way of example, which, for example, can also interact with the color center (FZ). The operative connection between the MOS circuit, the CMOS circuit, the BICMOS circuit, the bipolar circuit or the other microelectronic circuit of the semiconductor crystal (Sub) on the one hand and the color center (FZ) is therefore an optical and/or electromagnetic and/or electronic operative connection.

In addition, the MOS circuit, CMOS circuit, BICMOS circuit, bipolar circuit or other microelectronic circuit of the semiconductor crystal (sub) preferably comprises an electromagnetic component, in particular a magnetic field generating component, for example a flat coil, and/or an electric field generating component, for example the electrode of a capacitor. This can be used, for example, to influence the optical properties of the color center (FZ). In the case of an electrode, this is preferably made of an electrically conductive material that is essentially transparent for the pump radiation of the color center (FZ) and/or the fluorescent radiation of the color center (FZ). In the case of an NV color center as the color center (FZ) of a diamond crystal as a further crystal, the electrode is preferably made of indium tin oxide (ITO) or a similar material. The color center of the further crystal (for example an NV center of a diamond nanocrystal) can thus interact with an electromagnetic wave which has passed through such a transparent electrode.

The color center of a further crystal can also be used (for example, an NV center of a diamond nanocrystal) emit an electromagnetic wave that passes through such a transparent electrode. The electric field generated by the transparent electrode can influence the properties of the color center (FZ) of the further crystal. The color center (FZ) is preferably placed in the vicinity of an edge of the transparent electrode, since the tip effect increases the field strength at the edge of the transparent electrode and the color center can thus be more strongly influenced. This electromagnetic component, for example said transparent electrode and/or said flat coil, is therefore preferably intended and/or suitable for changing physical parameters, in particular optical parameters of the color center (FZ).

In an analogous manner, it can be useful that the MOS circuit, CMOS circuit, BICMOS circuit, bipolar circuit or other microelectronic circuit of the semiconductor crystal (sub) comprises an electromagnetic component, in particular a magnetic field generating component and/or an electrical Field-generating component and that this electromagnetic component is intended and/or suitable to modify physical parameters, in particular optical parameters of the color center (FZ), depending on states of the MOS circuit, CMOS circuit, the BICMOS circuit, the bipolar circuit or the other microelectronic circuit of the semiconductor crystal (Sub). The MOS circuit, the CMOS circuit, the BICMOS circuit, the bipolar circuit are then enabled to change the state of the color center (FZ). The MOS circuit or the CMOS circuit or the BICMOS circuit or the bipolar circuit preferably evaluates the state of light-sensitive sensors (nG, pG), which depends on the light emission of the color center (FZ). It is also useful if the MOS circuit or CMOS circuit, or the BICMOS circuit, or the bipolar circuit can control the radiation of electromagnetic waves into the color center (FZ).

If the further crystal has at least two color centers (FZ), it is advisable for some applications that they are prearranged and intended to enter into a physically observable interaction. This is useful, for example, for applications in quantum computing. For example, it can be useful if two NV centers in a diamond crystal interact with one another, in particular are entangled.

For this purpose it makes sense if the MOS circuit, or the CMOS circuit, or the BICMOS circuit, or the bipolar circuit or the other microelectronic circuit of the semiconductor crystal (sub) comprises means, in particular electrodes, which in particular can be made of ITO or similar materials, and/or device parts that generate magnetic fields, which are intended to detect and/or influence the interaction of the at least two color centers (FZ). For example, electrostatic fields can be used to change the optical properties, which can be used to select and de-select individual color centers of the color centers (FZ).

The disclosure also comprises a carrier material (TM) for use in a method for producing a quantum technological, micro-electro-optical or microelectronic or photonic system, wherein the carrier material (TM) is intended that a nanoparticle (NP), in particular a nanocrystal and/or a nanoscopic device, is embedded into the carrier material (TM).

The nanoparticle (NP) has at least one color center (FZ) with at least one characteristic electromagnetic wavelength and/or at least one electromagnetic resonance wavelength. An NV center in a diamond, for example, has two characteristic wavelengths: a green pump wavelength, with which the NV center is irradiated in order to excite it, and a fluorescence wavelength, with which the NV center is fluorescent dependent on the magnetic flux density B at the location of the NV center. So that the color center (FZ) can interact with the optical functional elements of the rest of the device, the carrier material (TM) attenuates the electromagnetic radiation of the at least one characteristic wavelength of the at least one color center (FZ) and/or the at least one resonance wavelength by no more than 50% and/or better no more than 25% and/or better no more than 10% and/or better no more than 5% when this electromagnetic radiation passes through a distance of 1 mm of the cured carrier material (TM) (e.g. in the form of said colloidal film). The carrier material (TM) is preferably gelatin. For example, the use of a nanoparticle (NP), which is a nanodiamond with an NV center (NV), or one of the other presented nanoparticles (NP) fits this.

Orientation of the Nanoparticles (NP)

Here a quantum technological or microelectronic or micro-optical or photonic system is presented that comprises a planar substrate (Sub) with a portion of a colloidal film (FM) that comprises at least one nanoparticle (NP) with a color center (FZ). The nanoparticle (NP) is provided with a sub-device in the form of an alignment aid (Fe), which allows alignment and/or positioning of the nanoparticle (NP) and/or the alignment of at least one axis of the nanoparticle (NP).

The planar substrate (Sub) is preferably provided with a sub-device in the form of a catching device (Fa) which allows alignment and/or positioning of the nanoparticle (NP) and/or the alignment of at least one axis (AS) of the nanoparticle (NP).

The nanoparticle (NP) is preferably a nanocrystal. The axis (AS) is preferably a crystal axis of the nanocrystal. The alignment aid (Fe) is preferably a ferromagnetic substructure of the nanoparticle (NP). The catching device (Fa) is preferably a ferromagnetic substructure of the planar substrate (Sub). The alignment aid (Fe) is preferably suitable and provided for exerting a translational force on the nanoparticle (NP) by means of a field. The catching device (Fa) is preferably suitable and/or provided by means of the alignment aid (Fe) and a field to exert a translational force on the nanoparticle (NP). The nanoparticle (NP) preferably has two alignment aids (Fe) and/or one alignment aid (Fe). The two alignment aids (Fe) and/or the one alignment aid (Fe) are preferably suitable and/or provided for at least temporarily exerting a torque on the nanoparticle (NP). The catching device (Fa) is preferably suitable and/or provided for exerting a torque on the nanoparticle (NP) by means of the alignment aid (Fe) and a field. This preferably the catching device (Fa) and/or the alignment aid (Fa) generate a magnetic and/or electrostatic and/or other electromagnetic field.

The catching device (Fa) and the alignment aid (Fe) preferably interact with one another. The safety device (Fa) is preferably suitable and/or intended to influence the placement and/or alignment of the nanoparticle (NP) by means of an interaction between the catching device (Fa) and the alignment aid (Fe).

Figure 10:
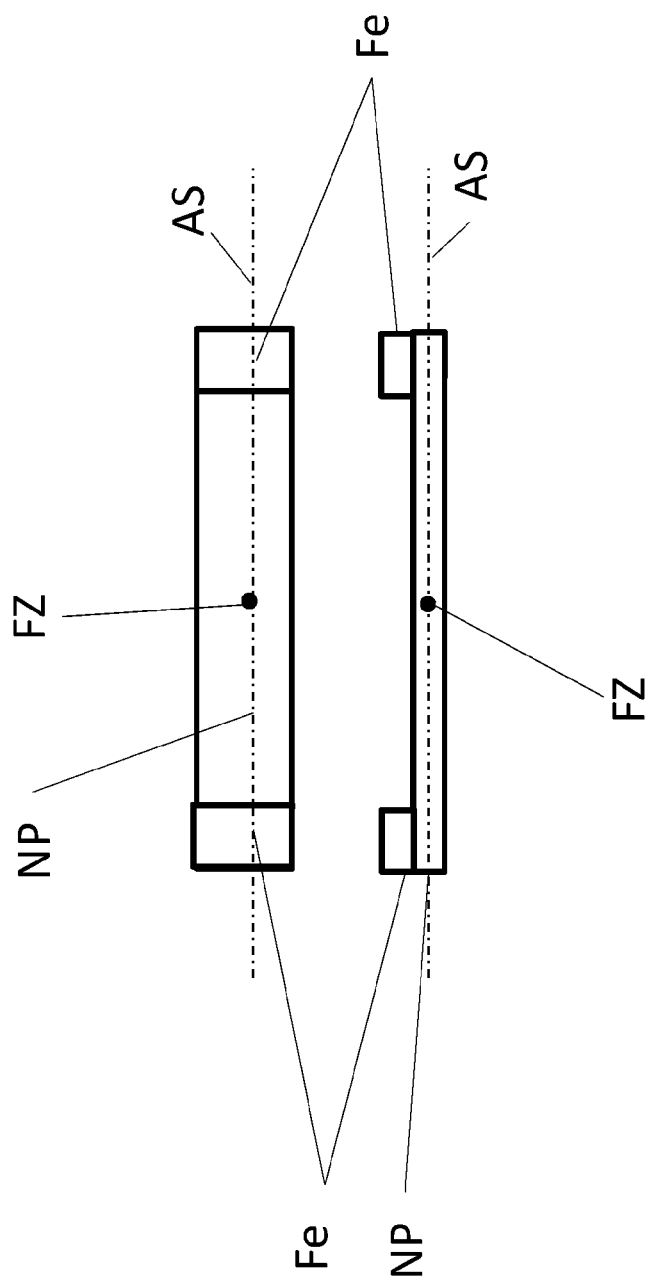
FIG. 10 illustrates an example nanoparticle (ND) with an alignment guide.

FIG. 10 shows an exemplary nanoparticle (NP) with a color center (FZ). The nanoparticle (NP) is cuboid. Its three side lengths are preferably different from one another The cube of the nanoparticle (NP) is provided with two of the aforementioned alignment aids (Fe) at two opposite ends. These are preferably permanent magnetic substructures, for example ferromagnetic iron or niobium layers, which are suitably premagnetized. The nanoparticle (NP) is preferably a nanocrystal, for example a nanodiamond crystal. The cuboid axis (AS) preferably coincides with a crystal lattice axis of the nanocrystal. The color center (FZ) is preferably produced in this cuboid axis (AS) by means of single ion implantation. In the case of a nanodiamond crystal, the color center is preferably an NV center. The other nanoparticles (NP) already mentioned and in particular the nano-LEDs are particularly pointed out here. Unless the alignment aids (Fe), as in the case of iron niobium, are electrically conductive, they can be used for the electrical contacting of electrically functional nanoparticles (NP) for example after coating with a corrosion protection, for example by means of a gold coating.

Figure 11:
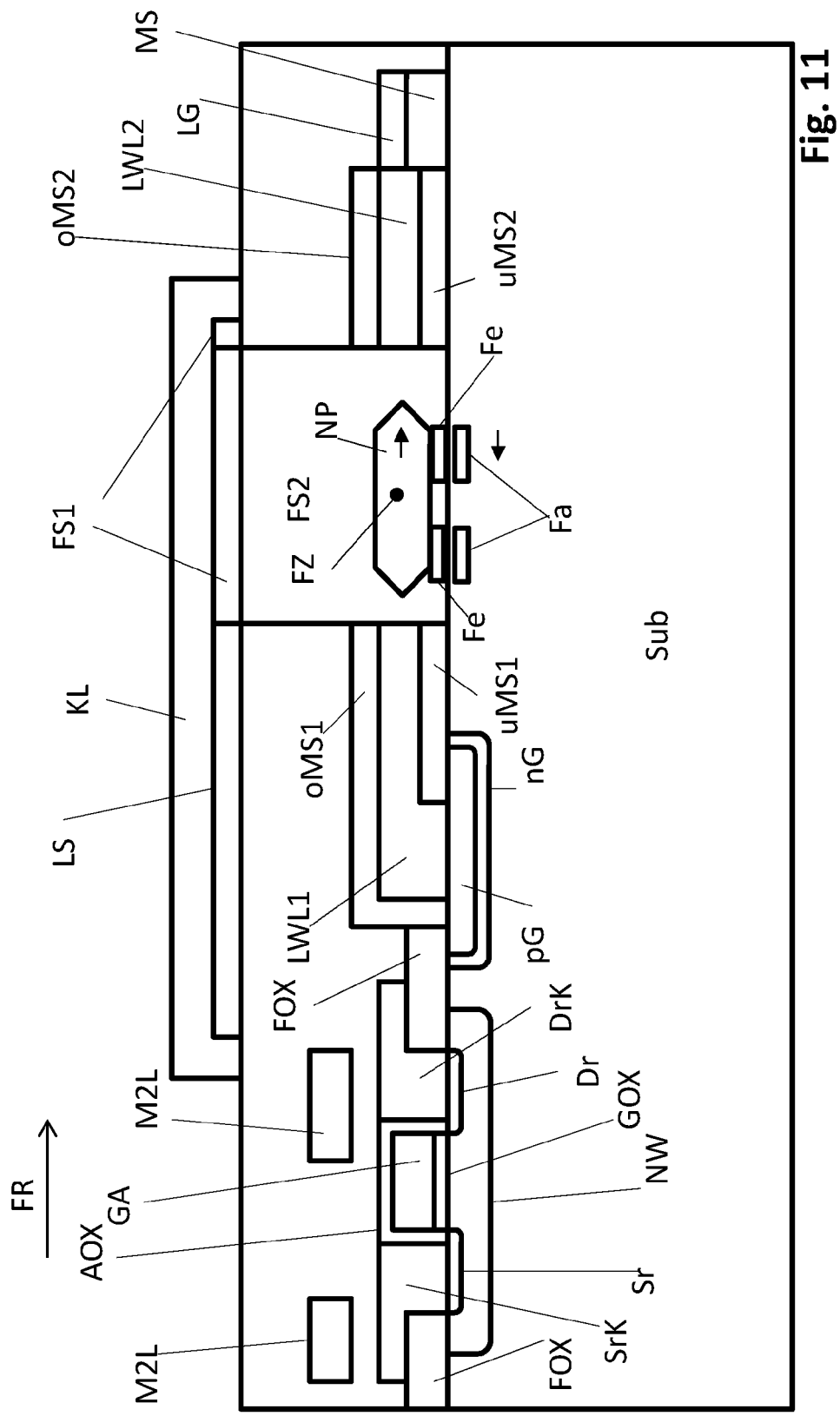
FIG. 11 corresponds with the example cross-section as shown in FIG. 8 wherein the nanoparticle comprises alignment aids.

While in FIG. 8 the nanoparticle comes to lie in a more or less arbitrary orientation during the coating process within the second catching structure (FS2), in FIG. 11 it comes to lie in a predefined orientation with an increased probability. For this purpose, the substrate of FIG. 11, in contrast to FIG. 8, has two catching devices (Fa) which, in cooperation with the alignment aids (Fe) of the nanoparticle, ensure suitable alignment of the nanoparticle (NP) in a predefined manner by translational forces and/or torques.

In many quantum technological devices, it is important to orient the nanoparticles (NP) in a predetermined manner. An exemplary process for this is described below. We refer again to FIG. 4. First, a planar substrate (sub) for depositing the nanoparticles (NP) is provided. (Step a of FIG. 4). It is advantageous to initially grow the nanoparticles (NP), as shown in FIG. 4, as nanocrystals with a predefined crystal orientation on a carrier material, here an exemplary deposition substrate (W). In the example in FIG. 4, it can be, for example, a diamond layer (D) on a silicon wafer as a deposition substrate (W), which is deposited in the following process step (step b of FIG. 4), for example by plasma deposition, on the silicon wafer as Deposition substrate (W). Various methods for producing oriented diamond layers on silicon wafers are known from the literature.

For example, through single ion implantation in combination with a heat treatment and, if necessary, the implantation of further atoms, such as sulfur, color centers (FZ) can now be generated in the functional layer (D) in a subsequent further process step (step d in FIG. 4).

In a further step (step d of FIG. 4), the functional layer (D) is preferably structured. This can be done for example by plasma etching and/or wet chemical etching and/or gas phase etching, etc. The structuring can optionally also take place during the deposition and/or after the deposition and before the production of the color centers (FZ). For example, it is advantageous to deposit the material of the layer (D) directly in the form of a needle with a predetermined crystal orientation.

In a last step (step e of FIG. 4), the produced nanoparticles (NP) are detached from the wafer (W), preferably by undercutting the material of the wafer (W) in the area of the nanoparticles (ND).

Figure 9:
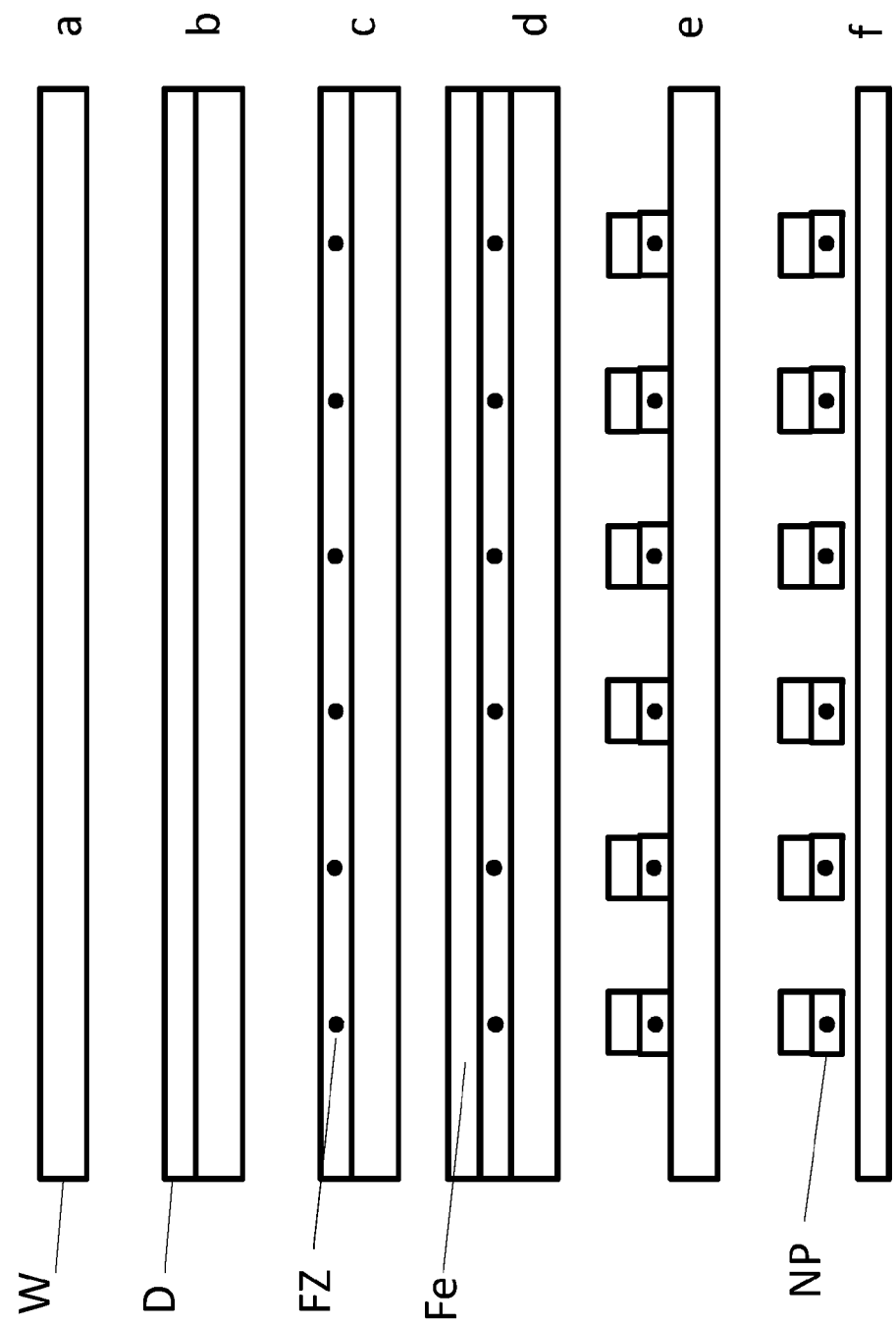
FIG. 9 illustrates an example detachment of nanoparticles (ND) with alignment aid.

The nanoparticles are now preferably provided with an alignment aid, for example in the form of a ferromagnetic substructure, before they are detached (step f of FIG. 9). This can be done, for example, by depositing an iron layer as an alignment aid (Fe) on the layer (D) (step d of FIG. 9). Typically, depending on the material of the layer (D), the deposition of a bonding layer is also necessary. Such a partial structure can also be produced by focused ion implantation, for example of iron. After structuring the iron layer, a gold layer or the like is preferably deposited and structured on the iron layer together with a bonding layer between the iron layer and gold layer.

The alignment aids (Fe) can preferably interact mechanically and/or magnetically and/or electrostatically and/or electromagnetically with the catching devices (Fa) of the planar substrate (Sub), which will be explained later.

The nanoparticles (NP) are typically also positioned on the wafer (W) by means of a structuring process (step e of FIG. 9).

Furthermore, the nanoparticles (NP) are typically detached from the wafer (W) again (step f of FIG. 9).

The sequence of the steps in FIGS. 4 and 9 can vary and, if necessary, be supplemented by further steps depending on the application.

The nanoparticles (NP) prepared in this way can then be used on a planar substrate (Sub), which preferably has catching devices (Fa) which interact with said alignment aids (Fe) of the nanoparticles (NP).

An interaction of the alignment aids (Fe) of the nanoparticles (NP) with one another within the colloidal lacquer can become a problem. The nanoparticles (NP) and the alignment aids (Fe) are designed so that the thickness of the nanoparticles (NP) is so great that a force between the alignment aids (Fe) of two nanoparticles is too small for agglomeration or that the alignment aid (Fe) of the nanoparticles (NP) of two nanoparticles (NP) repel each other on direct contact.

This then results in a method for manufacturing a quantum technological or microelectronic or micro-optical or photonic system with the following steps:

Providing a planar substrate (Sub);
Application and, if necessary, structuring of a colloidal film (FM) using a colloidal lacquer (KL) which has at least one nanoparticle (NP) with a color center (FZ), in particular also by lacquering and/or printing and/or spraying and/or local wetting and/or coating;
Alignment and/or positioning of the nanoparticle (NP) by means of a partial device of the nanoparticle (NP) in the form of an alignment aid (Fe), which aligns the nanoparticle (NP) and/or at least one axis (AS) of the nanoparticle (NP) and/or a positioning of the nanoparticle (NP) on the substrate relative to other functional elements of the planar substrate (Sub) e.g. optical functional elements such as light wave guides (LWL1, LWL2).

The additional step of aligning and/or positioning the nanoparticle (NP) by means of a magnetic and/or electrical and/or other electromagnetic field by interaction with the alignment aid (Fa) then results as a further process step. For this purpose, one or preferably more catching structures (Fa), which can interact with the alignment aids (Fe) of the nanoparticles (NP), are preferably produced on the planar substrate (Sub) before the colloidal lacquer (KL) is applied. The nanoparticles (NP) in the colloidal lacquer (KL) are preferably nanocrystals. If an axis (AS) of such a nanocrystal becomes aligned by such an alignment structure (Fa), the axis (AS) that is aligned is preferably a crystal axis of the nanocrystal. This is of particular importance because the optical properties and other properties of color centers (FZ) in nanocrystals are typically not independent of the crystal orientation. The alignment aid (Fa) is particularly preferably manufactured as a ferromagnetic sub-structure of the nanoparticle (NP), since such ferromagnetic substructures are easy to manufacture in planar technology before the nanoparticles (NP) are detached from an auxiliary carrier.

When the colloidal varnish (KL) is applied, it flows with the previously prepared nanoparticles (NP), which comprise a color center (FZ) and an alignment aid (Fa), over the substrate (Sub). Catching devices (Fa), which are preferably manufactured on or in the planar substrate (Sub), then preferably exert a force and/or a torque on the nanoparticles (NP) carried along by the carrier means (TM) of the colloidal lacquer (KL).

In a method modified in this way, a translational force and/or a torque is thus exerted by means of the alignment aid (Fe) of the respective nanoparticle (NP) and a field on the nanoparticle (NP), whereas the field preferably being generated by a catching device (Fa) of the planar substrate (Sub). It is of course conceivable to generate the fields in the turntable of a spin coater (SC) instead of such catching devices (Fa) of the planar substrate. For the purposes of this disclosure, such field-generating devices should also be viewed as catching devices (Fa) of the planar substrate (Sub).

The proposed method therefore preferably also comprises the step of generating a field that interacts with the alignment aid (Fe) of the nanoparticle (NP) by a sub-device of the planar substrate (Sub), which is referred to below as the catching device (Fa).

To imagine an exemplary placement process, let us assume that the nanoparticles (NP) have a more or less rectangular needle shape (FIG. 10), whereas the needle shape being predetermined by a nanocrystal that is part of the respective nanoparticle (NP). The nanoparticle (NP) has two ferromagnetic areas at its ends as an alignment aid (Fe). In FIG. 10, such a nanoparticle (NP) is shown schematically as an example in a top view and side view.

FIG. 11 corresponds to FIG. 8, which is now intended to clarify the interaction between the nanoparticle (NP) and the planar substrate (Sub). An exemplary CMOS wafer is again used as an exemplary planar substrate (sub), but which is now equipped with, for example, ferromagnetic catching devices (Fa). The following explanations can also be extended to MOS wafers, BICMOS wafers, wafers in bipolar technology and the like. In these techniques, the circuits preferably have at least one transistor, which typically interacts indirectly with a color center of the nanoparticle (NP) via a partially optical path. Such interaction can, for example, affect the excitation of a pump light source for the color center by the transistor.

Since the nanoparticle (NP) strives to achieve a minimal energy level, it will be arrange itself in such a way that the magnetic poles of its exemplary ferromagnetic alignment aid (Fe) are anti-parallel to the magnetic poles of the preferably ferromagnetic catching devices (Fa) of the planar substrate (Sub). This anti-parallelism is indicated by the corresponding arrows in FIG. 11.

If the interaction between the catching devices (Fa) of the planar substrate (Sub) and the alignment aids (Fe) of the nanoparticles (NP) is to be of a magnetic nature, it is helpful if the nanoparticles (NP) are magnetized along their axis (reference symbol AS in FIG. 10) and the catching devices (Fe) parallel to the surface of the planar substrate (Sub).

Then, for example, the nanoparticle (NP) can be placed on the planar substrate (Sub) by means of an interaction between the alignment aid (Fe) of the nanoparticle (NP) and a catching device (Fa) of the planar substrate (Sub).

This is then typically also associated with an alignment of the nanoparticle (NP) through this interaction on the planar substrate (Sub) by means of this interaction between the alignment aid (Fe) of the nanoparticle and the catching device (Fa) of the planar substrate (Sub).

The technical teaching disclosed here enables the production of microelectronic MOS, CMOS, BICMOS and bipolar circuits that include NV color centers. You can also use the printing process to manufacture thick-film circuits which include at least one paramagnetic center, in particular an NV color center. This unites what are actually incompatible worlds and opens them up to the possibility of cost-effective mass production.

The manufacturing process presented here enables the combination of diamond nanocrystals with a MOS technique and with a CMOS technique and with a BICMOS technique and with a bipolar technique as well as the combination with thick film techniques. However, the advantages are not limited to this. At this point, reference should be made to the book by Tapan K. Gupta "Handbook of Thick- and Thin-Film Hybrid Microelectronics", Wiley, May 13, 2003. The combination of the techniques disclosed herein with the methods and devices described therein is an explicit part of this disclosure.

Features of the Invention

Feature 1 is a method of manufacturing a quantum-technological, micro-electro-optical or micro-electronic or photonic system, comprising the steps of:
providing a planar substrate (sub),
wherein the planar substrate (sub) is at least in part
a semiconductor wafer and/or another semiconductor substrate or a silicon wafer or a GaAs wafer or a wafer of IV material or a wafer of III/V material or a wafer of II/VI material or a wafer of mixtures of such materials or a germanium wafer or a mono- or polycrystalline diamond wafer or a part thereof, or
a glass wafer and/or a ceramic wafer and/or a metal sheet or a plastic plate or a part thereof, and
wherein the planar substrate (sub) comprises, at the end of the process, at least one electronic circuit of at least two electrical components which is mechanically fixed located on the planar substrate (sub) or located in the planar substrate (sub);
providing a colloidal lacquer (KL);
lacquering and/or printing and/or coating and/or locally wetting the planar substrate (sub) with the colloidal lacquer (KL) to obtain a colloidal film (FM) on a surface (OF) of the planar substrate (sub),
wherein the lacquering and/or printing and/or coating and/or local wetting may be performed in a patterned manner and/or wherein the method may comprise patterning the colloidal film (FM) as a process step;
curing and/or drying of the colloidal film (FM),
so that a partial area of the solidified colloidal film (FM) formed by means of this process is firmly bonded to this surface (OF) of the planar substrate (Sub),
characterized in,
that the colloidal lacquer (KL) comprises nanoparticles (NP) in a carrier material (TM),
wherein at least some or all of the nanoparticles (NP) having one or more color centers (FZ).
the colloidal lacquer includes nanoparticles in a carrier material, and
at least some of the nanoparticles have one or more color centers.

Feature 2 is a quantum technological and/or micro-electro-optical and/or micro-electronic and/or photonic system
comprising a planar substrate (sub) which is a part of a MOS wafer or a part of a CMOS wafer or a part of a BICMOS wafer or a part of a wafer processed in a bipolar technology,
wherein the planar substrate (sub) comprises at least one transistor and/or a microelectronic circuit with at least one transistor or with at least one diode,
characterized in
that the surface (OF) of the planar substrate (Sub) has a partial area of a solidified colloidal film (FM), and
that the partial area of the solidified colloidal film (FM) is firmly connected to said surface (OF) of the planar substrate (Sub), and
that the partial region of the solidified colloidal film (FM) comprises at least one nanoparticle (NP) having a color center (FZ).

Feature 3 is a quantum technological, micro-electro-optical, micro-electronic or photonic system
manufactured by means of a process according to feature 1.

Feature 4 is a quantum technological, micro-electro-optical, micro-electronic or photonic system according to one or more of features 2 to 3.
wherein the planar substrate (Sub) comprises at least one micro-optical functional element (LWL1, LWL2).

Feature 5 is a quantum technological, micro-electro-optical, micro-electronic or photonic system according to one or more of features 2 to 4
wherein the quantum technological, micro-electro-optical, micro-electronic or photonic system has an excitation device adapted to cause magnetic excitation at the location of the nanoparticle (NP), and
wherein the excitation device is a sub-device of the planar substrate (Sub).

Feature 6 is a quantum technological, micro-electro-optical, microelectronic or photonic system according to one or more of features 2 to 5.
wherein the quantum technological, micro-electro-optical, micro-electronic or photonic system is microwave-free.

Feature 7 is a quantum technological, micro-electro-optical, micro-electronic or photonic system according to one or more of features 2 to 6
wherein the system comprises at least one photosensitive electronic device (nG, pG) that is part of the substrate (Sub) or is fixedly connected to the surface (OF) of the substrate (Sub).

Feature 8 is a quantum technological, micro-electro-optical, micro-electronic or photonic system
comprising a planar substrate (Sub) made of a direct semiconductor material, wherein the semiconductor material may be a III/V semiconductor material and/or a II/VI semiconductor material or a semiconductor material produced by bandgap engineering, and
comprising a microelectronic circuit which is part of the substrate (Sub), and
with an electrical component which is part of the microelectronic circuit, and
with a micro-optical sub-device (LWL1, LWL2) which is part of the substrate (sub), and
comprising one or more nanoparticles (NP), which may be diamonds, comprising one or more color centers (FZ), each of which may be one or more NV centers in the diamond or diamonds, and the planar substrate (Sub) thus comprising the microelectronic circuit and the electrical device and the micro-optical device (LWL1, LWL2), characterized in that it comprises at least one light-emitting electro-optical component (MS) which is part of the substrate (Sub) or is fabricated on the surface of the substrate (Sub), wherein the planar substrate (sub) comprises the light emitting device (MS), and wherein the light emitting electro-optical component (MS) optically interacts with the micro-optical sub-device (LWL1, LWL2), and wherein the light-emitting electro-optical component (MS) interacts electrically and/or optically with the electrical component in a direct or indirect manner by means of the micro-optical sub-device (LWL1, LWL2), and wherein this interaction between the light-emitting electrooptical component (MS) and the electrical component takes place with participation of the color center (FZ) or a plurality of color centers of the color centers (FZ).

Feature 9 is a quantum technological, micro-electro-optical, micro-electronic or photonic system comprising a planar substrate (sub) of an indirect semiconductor material and with a microelectronic circuit in MOS-technology or CMOS-technology or BICMOS-technology or bipolar-technology which is part of the substrate (sub), and with an electrical component which is part of the microelectronic circuit, and with a micro-optical sub-device (LWL1, LWL2) which is part of the substrate (sub), and wherein the planar substrate (sub) thus comprises the microelectronic circuit and the electrical component and the micro-optical device (LWL1, LWL2), characterized in that it comprises at least one light-emitting electro-optical component (MS) which is part of the substrate (Sub) or is fabricated on the surface of the substrate (Sub), wherein the planar substrate (sub) comprises the light emitting device (MS), and wherein the planar substrate (sub) is made of an indirect semiconductor, and wherein the light emitting electro-optic device (MS) interacts optically with the micro-optic sub-device (LWL1, LWL2), and wherein the light-emitting electro-optical component (MS) interacts electrically and/or optically with the electrical component in a direct or indirect manner by means of the micro-optical sub-device (LWL1, LWL2).

Feature 10 is a quantum technological, micro-electro-optical, micro-electronic or photonic system comprising a substrate (Sub) having a surface (OF);

comprising a semiconducting MESA structure (MESA) of an indirect semiconductor material isolated from the substrate (Sub), said semiconducting MESA structure (MESA) comprising a first region (E) and a second region (B) and a third region (C), and wherein the first region (E) has a first conductivity type, and wherein the second region (B) has a second conductivity type, and wherein the third region (C) has a first conductivity type, and wherein the first region (E) and the second region (B) and the third region (C) form an NPN structure or a PNP structure, and wherein the second region (B) is disposed between the first region (E) and the second region (C), and wherein the width of the second region (B) is less than 3 µm and/or less than 1 µm and/or less than 500 nm and/or less than 200 nm and/or less than 100 nm and/or less than 50 nm and/or less than 25 nm and/or less than 10 nm, and wherein the second region (B) emits light when a sufficiently high electrical voltage is applied between the first region (E) and the third region (C), characterized in in that a microelectronic circuit in MOS technology or CMOS technology or BICMOS technology or bipolar technology is part of the substrate (sub) and in that a nanoparticle (NP) having a color center (FZ) is firmly connected to the substrate (sub), and that a micro-optical functional element (LWL1, LWL2) is fabricated in or on the substrate (sub) and in that light emitted by the second region (B) interacts with the color center (FZ) of the nanoparticle (NP) and/or with the combination of micro-optical functional element (LWL1, LWL2) and the color center (FZ) of the nanoparticle (NP).

Feature 11 is a quantum technological, micro-electro-optical, micro-electronic or photonic system comprising a substrate (sub) having a surface (OF);

comprising a silicon avalanche light emitting diode fabricated in or on said substrate (sub), said silicon avalanche light emitting diode emitting light upon application of a sufficiently high electrical voltage characterized in, that a nanoparticle (NP) having a color center (FZ) is fixedly connected to the substrate (sub), and that a micro-optical functional element (LWL1, LWL2) is fabricated in or on the substrate (sub) and in that light emitted by the silicon avalanche light-emitting diode interacts with the color center (FZ) of the nanoparticle (NP) and/or with the combination of micro-optical functional element (LWL1, LWL2) and the color center (FZ) of the nanoparticle (NP).

Feature 12 is an integrated circuit comprising a microelectronic circuit characterized in in that the microelectronic circuit is manufactured in MOS technology or CMOS technology or BICMOS technology or bipolar technology, and in that it comprises at least one crystalline sub-device, in particular a nanoparticle (NP) or nanocrystal or crystal or a diamond, with one or more color centers (FZ), and in that the crystalline sub-device is firmly bonded to the substrate (Sub), and that the one color center (FZ) or the plurality of color centers is a functional element for the intended use of the integrated circuit.

Feature 13 is a quantum technological, micro-electro-optical, micro-electronic or photonic system, characterized in, that the system comprises a microelectronic circuit fabricated in or on the planar substrate (sub) in MOS technology or CMOS technology or BICMOS technology or bipolar technology, and in that the planar substrate (sub) comprises a solidified, structured, colloidal film (FM) on the surface (OF) of the planar substrate (sub), which colloidal film (FM) is firmly bonded to the surface (OF) of the planar substrate (sub) and thus forms a unit with the planar substrate, and that the colloidal film (FM) comprises nanoparticles (NP) and in that at least some of the nanoparticles (NP) have one or more color centers (FZ), and that the color center (FZ) interacts with the microelectronic circuit or with parts thereof.

Feature 14 is a quantum technological, micro-electro-optical, micro-electronic or photonic system
  wherein the system comprises a solidified colloidal film having one or more color centers (FC), and
  wherein the system comprises other means for intended operation, which may include, but are not limited to, electrical circuitry, electro-optical device parts, electro-magnetic device parts, and/or optical device parts, and
  wherein the intended use of the system is performed by means of an interaction between at least one color center (FZ) and at least one of said means
  characterized in that the solidified colloidal film (FM) has been produced by printing or spraying and solidification onto a surface (OF).

Feature 15 is a quantum technological, micro-electro-optical, micro-electronic or photonic system, characterized in,
  that the planar substrate (sub) is at least partially a glass wafer or a ceramic wafer or a plastic wafer or a piece of such glass wafer or ceramic wafer or plastic wafer or functionally equivalent forms of glass or plastic or ceramic, and
  that the planar substrate (sub) has a printed and solidified colloidal film (FM) on the surface (OF) of the planar substrate (sub) which is firmly bonded to the surface (OF) of the planar substrate (sub), and
  that the colloidal film (FM) comprises nanoparticles (NP), and
  that at least a part of the nanoparticles (NP) have one or more color centers (FZ).

Feature 16 is a quantum technological and/or micro-electro-optical and/or micro-electronic and/or photonic system
  comprising a planar substrate (sub) and
  wherein the planar substrate (sub) is at least partially
    a semiconductor wafer and/or another semiconductor substrate or a silicon wafer or a GaAs wafer or a wafer of IV material or a wafer of III/V material or a wafer of II/VI material or a wafer of mixtures of such materials or a germanium wafer or a mono- or polycrystalline diamond wafer or a part thereof, or
    a glass wafer and/or a ceramic wafer and/or a metal sheet or a plastic plate or a part thereof, and
  with a crystal, in particular a nanoparticle (NP),
  wherein planar substrate (Sub) (Sub) comprises a MOS circuit or a CMOS circuit or a BICMOS circuit or a bipolar circuit or another microelectronic circuit fabricated or on the planar substrate (Sub) and
  wherein the crystal (NP) has at least one color center (FZ)
characterized in
  that the crystal (NP) is mechanically firmly connected to the planar substrate (Sub) and
  in that there is an electromagnetic active connection between the color center (FZ) of the crystal (NP) and at least part of the MOS or CMOS or BICMOS or bipolar circuit or the other microelectronic circuit of the planar substrate (sub).

Feature 17 is a system according to the preceding feature characterized in,
  that the MOS or CMOS or BICMOS or bipolar circuit or the other microelectronic circuit of the semiconductor crystal (Sub) comprises an electromagnetic component and/or a magnetic field generating component and/or an electric field generating component and
  in that this electromagnetic component is intended and/or suitable for changing physical parameters and/or optical parameters of the color center (FZ) or in that this electromagnetic component is intended and/or suitable for changing physical parameters and/or optical parameters of the color center as a function of states of the MOS or CMOS or BICMOS or bipolar circuit or of the other microelectronic circuit.

Feature 18 is a system according to one or more of the two preceding features characterized in,
  that the nanoparticle (NP) comprises at least two color centers (FZ) and
  that these are intended and provided to enter into a physically observable interaction with each other.

Feature 19 is a system according to the preceding feature characterized in,
  that the MOS or CMOS or BICMOS or bipolar circuit or the other microelectronic circuit of the semiconductor crystal (sub) or the planar substrate (sub) comprises means and/or electrodes and/or magnetic field generating device parts which are provided to detect and/or influence the interaction of the at least two color centers (FZ).

Feature 20 is a quantum technological and/or micro-electro-optical and/or micro-electronic and/or photonic system
  comprising a planar substrate (Sub);
  comprising a first portion of a first colloidal film (FM) comprising at least a first nanoparticle (NP) having a color center (FZ), and
  a second portion of a second colloidal film (FM) comprising at least one second nanoparticle (NP) having ferromagnetic properties in at least a portion of said nanoparticle (NP), and
  wherein said first colloidal film (FM) can be identical to said second colloidal film (FM), and
  wherein the first sub-region can be identical to the second sub-region, and
  wherein the first nanoparticle and the second nanoparticle can be identical.

Feature 21 is a quantum technological and/or micro-electro-optical and/or micro-electronic and/or photonic system according to the preceding features
  comprising a planar substrate (Sub);
  comprising a first portion of a first colloidal film (FM) comprising at least a first nanoparticle (NP) having a color center (FZ) and
  wherein the nanoparticle (NP) is provided with a partial device in the form of an alignment aid (Fe) allowing alignment and/or positioning of the nanoparticle (NP) and/or alignment of at least one axis (AS) of the nanoparticle (NP).

Feature 22 is a method of fabricating a quantum technological and/or micro-electro-optical and/or micro-electronic and/or photonic system comprising the steps of:
  providing a planar substrate (sub),
  wherein the planar substrate (sub) is at least in part
    a semiconductor wafer and/or another semiconductor substrate or a silicon wafer or a GaAs wafer or a wafer of IV material or a wafer of III/V material or a wafer of II/VI material or a wafer of mixtures of such materials or a germanium wafer or a mono- or polycrystalline diamond wafer or a part thereof, or a glass wafer and/or a ceramic wafer and/or a metal sheet or a plastic plate or a part thereof;

applying and optionally structuring a colloidal film (FM) comprising at least one nanoparticle (NP) with a color center (FZ), in particular also by coating and/or printing and/or spraying and/or local wetting;

aligning and/or positioning the nanoparticle (NP) by means with a sub-device of the nanoparticle (NP) in the form of an alignment aid (Fe) which permits alignment of the nanoparticle (NP) and/or at least one axis (AS) of the nanoparticle (NP) and/or positioning of the nanoparticle (NP).

LIST OF REFERENCE SYMBOLS

1 Beginning of the coating process for applying the nanoparticles (ND) to a substrate (Sub) by means of a spin coater (SC)
2 Providing the planar substrate (Sub)
3 Providing of the lacquer in the form of a colloidal solution (KM) of nanoparticles (ND) in a carrier material (TM)
4 Photolithography
5 Plasma treatment
6 Paint removal
7 Lacquering (7) (possibly also coating, local wetting or printing) of the planar substrate (Sub) with the colloidal solution (KM) of the nanoparticles (ND) in order to obtain a colloidal film (FM) on a surface (OF) of the planar substrate (Sub)
8 Partial hardening of the colloidal film (FM) (English: pre-bake)
9 Structuring of the colloidal film (FM)
10 Curing of the colloidal film (FM) (English: post-bake)
AS Cuboid axis
AOX Cover oxide of the exemplary CMOS circuit
D Functional layer. In the example of FIG. 4, it is an exemplary diamond layer on an exemplary silicon wafer as deposition substrate (W).
DP Dispenser
Dr Drain region of the exemplary CMOS transistor
DrK Drain contact of the exemplary CMOS transistor
Fa Catching device (trapping device)
Fe Alignment aid
FM Colloidal film of the colloidal varnish (KM) on the substrate (sub)
FOX field oxide of the exemplary CMOS circuit
FR lacquer flow direction of the colloidal lacquer (KL) during lacquer coating
FS catching structure. The catching structure is used to stop the movement of the Nanoparticles (NP) on the surface (OF) of the substrate to be coated (Sub) during the coating. It is preferably used in conjunction with the guiding structure (LS) and the shape of the nanoparticles (NP) and possibly further functional elements of the surface of the planar substrate (Sub) and possibly further functional elements of the nanoparticles (NP) also for aligning the nanoparticles (NP) relative to the direction of movement, the direction of flow (FR), of the colloidal varnish and relative to the surface normal of the surface (OF) of the planar substrate (Sub) to be coated.
FS1 exemplary first partial catching structure of the exemplary catch structure (FS). The first partial catching structure serves here, as an example, to reduce the chance of a nanoparticle (NP) to escape once it has been trapped
FS2 exemplary second partial catching structure of the exemplary catch structure (FS). The exemplary second partial catching structure is used for the final positioning and alignment of the captured nanoparticle (NP). The second partial catching structure is preferably manufactured together with the first partial catching structure (FS2) in such a way that, in cooperation with the first partial catching structure, it ensures the trapping of precisely one nanoparticle (NP). For example, the dimensions can be like this be chosen so that after the capture of the nanoparticle (NP) with a previously known geometry, no further nanoparticles (NP) are captured.
FZ Color center. This can be, for example, an NV center (NV) in a diamond nanocrystal (ND) and/or an SiV center (SiV) in a diamond nanocrystal and/or an H3 center in a diamond nanocrystal
GA Gate connection=control electrode of the exemplary CMOS transistor
GOX Gate oxide of the exemplary CMOS transistor
KL Colloidal mixture, also referred to here as colloidal varnish or colloidal lacquer
LG Light emitting area of the MESA structure (MS)
LM Solvent
LS Guiding structure. The lead structure directs the movement of the nanoparticles (NP) on the surface (OF) of the planar substrate (Sub) to be lacquered towards a target.
LWL1 First optical light waveguide structure
LWL2 Second optical light waveguide structure
M2L Exemplary second metal layer of exemplary CMOS transistor
MS Mesa structure. In the example presented here, the MESA structure is an NPN transistor or a PNP transistor with an extremely thin base that is very highly doped and that is preferably operated in breakdown so that the hot electrons emit light
ND Nanodiamond as an example of a functional nanoparticle (NP)
nG N well of the photosensitive component of the CMOS circuit
NP Nanoparticles. This can be, for example, amorphous nanoparticles but also nanocrystals. In particular, it can be nanodiamond and/or nano-silicon crystals and/or nano-glass particles and/or other nano-crystals and/or nano-particles in general
NV NV color center in a nanodiamond (ND) as an example of a color center (FZ) in a nanocrystal as an exemplary nanoparticle (NP)
NW N well of the exemplary CMOS transistor
OF Surface of the planar substrate (Sub)
oMS 1 First section of the second metal diaphragm
oMS2 Second section of the second metal diaphragm
pG Cathode of the exemplary PN diode, which is used as an exemplary photosensitive component serves
RA Axis of rotation of the spin coater (SC)
SA Axis of symmetry
SC Spin coater with turntable
Sr Source region of the exemplary CMOS transistor
SrK Source contact of the exemplary CMOS transistor
Sub Planar substrate, preferably a wafer
TM Carrier material such as gelatin
uMS 1 First section of the first metal diaphragm
uMS2 Second section of the first metal diaphragm VR Stirring or other suitable mixing of the nanoparticles (NP) or nanodiamonds (ND) with the carrier material (TM)

W Exemplary deposition substrate for the production of functional nanoparticles (NP). In FIG. 4, for example, a silicon wafer

What is claimed is:

1. A quantum computing system comprising:
   a planar substrate of a direct or indirect semiconductor material;
   a microelectronic circuit which is part of the substrate;
   an electrical component which is part of the microelectronic circuit, wherein the microelectronic circuit includes at least one transistor or at least one diode;
   a micro-optical subdevice which is part of the planar substrate, such that the planar substrate thus includes the microelectronic circuit and the electrical component and the micro-optical subdevice;
   at least a first aligned nanoparticle and a second aligned nanoparticle, each aligned nanoparticle having one or more color centers, and each aligned nanoparticle comprising an alignment aid, wherein the alignment aid determines alignment of at least one axis of the aligned nanoparticle; and
   at least a first portion of a solidified colloidal film, wherein at least the first aligned nanoparticle is comprised within the first portion of the solidified colloidal film;
   wherein:
   the first portion of the solidified colloidal film comprising at least the first aligned nanoparticle is firmly bonded to the planar substrate;
   the system further comprises at least one light-emitting electro-optical component which is part of the planar substrate or is fabricated on the surface of the planar substrate;
   the light-emitting electro-optical component interacts optically with the micro-optical subdevice;
   the light-emitting electro-optical component interacts electrically and/or optically with the electrical component in a direct or indirect manner based on the interaction with the micro-optical subdevice; and
   the interaction between the light-emitting electro-optical component and the electrical component takes place with an involvement of the color center or a plurality of color centers.

2. The quantum computing system of claim 1, wherein each of the first aligned nanoparticle and the second aligned nanoparticle are diamonds and each of the one or more color centers in each of the respective first aligned nanoparticle and second aligned nanoparticle are respectively one or more NV centers in the respective diamonds; and wherein at least two of the NV centers are entangled to perform operations of the quantum computing system.

3. The quantum computing system according to claim 1 wherein the planar substrate is:
   a direct semiconductor material, wherein the semiconductor material of the planar substrate may be a III/V semiconductor material and/or a II/VI semiconductor material or a semiconductor material produced by bandgap engineering; or
   an indirect semiconductor material, with a microelectronic circuit in MOS technology or CMOS technology or BICMOS technology or bipolar technology, which is part of the substrate.

4. The quantum computing system according to claim 1 wherein:
   the planar substrate is an indirect semiconductor material;
   the planar substrate includes a microelectronic circuit in MOS technology or CMOS technology or BICMOS technology or bipolar technology, which is part of the substrate;
   the system includes a silicon avalanche light emitting diode fabricated in or on the substrate;
   the silicon avalanche light emitting diode emits light when a sufficiently high electrical voltage is applied; and
   light emitted by the silicon avalanche light emitting diode interacts with the color center of the first aligned nanoparticle and/or with a combination of the electro-optical subdevice and the color center of the first aligned nanoparticle.

5. An integrated circuit comprising a microelectronic circuit for use in a system according to claim 1, wherein:
   the microelectronic circuit is manufactured in MOS technology or CMOS technology or BICMOS technology or bipolar technology, and
   the plurality of color centers are a functional element for the intended use of the integrated circuit.

6. The quantum computing system according to claim 1, wherein:
   the system comprises a microelectronic circuit fabricated in or on the planar substrate using MOS technology or CMOS technology or BICMOS technology or bipolar technology, and
   the two or more color centers interact with the microelectronic circuit or with parts thereof.

7. The quantum computing system according to claim 1 wherein:
   the planar substrate is at least in part a semiconductor wafer and/or other semiconductor substrate or a silicon wafer or a GaAs wafer or a wafer of IV material or a wafer of III/V material or a wafer of II/VI material or a wafer of mixtures of such materials or a germanium wafer or a mono-or polycrystalline diamond wafer or a portion thereof,
   the planar substrate includes a MOS circuit or a CMOS circuit or a BICMOS circuit or a bipolar circuit or other microelectronic circuit fabricated in or on the planar substrate; and
   there is an electromagnetic effective connection between the color center of the first aligned nanoparticle and at least part of the MOS or CMOS or BICMOS or bipolar circuit or the other microelectronic circuit of the planar substrate.

8. The quantum computing system according to claim 7, wherein:
   the MOS or CMOS or BICMOS or bipolar circuit or the other microelectronic circuit comprises an electromagnetic component including an electromagnetic device and/or a magnetic field generating device and/or an electric field generating device, and
   the electromagnetic component is intended and/or suitable for changing physical parameters and/or optical parameters of the two or more color centers or in that this electromagnetic component is intended and/or suitable for changing physical parameters and/or optical parameters of the two or more color centers as a function of states of the MOS or CMOS or BICMOS or bipolar circuit or of the other microelectronic circuit.

9. The quantum computing system according to claim 1 wherein:
   the first aligned nanoparticle has at least two color centers; and the at least two color centers are intended and designed to interact with one another in a physically observable manner.

10. The quantum computing system according to claim 9, wherein:
the MOS or CMOS or BICMOS or bipolar circuit or the other microelectronic circuit has electrodes and/or magnetic field-generating device parts which are intended to detect and/or influence the interaction of the at least two color centers.

11. A quantum computing system comprising:
a planar substrate of a semiconductor material including a micro-optical functional element;
wherein:
the planar substrate is a part of a MOS wafer or a part of a CMOS wafer or a part of a BICMOS wafer or a part of a wafer processed in a bipolar technology;
the planar substrate includes at least one microelectronic circuit with at least one transistor or with at least one diode;
the microelectronic circuit is an electronic circuit including at least two electrical components which is mechanically fixed on the planar substrate or in the planar substrate;
a photosensitive electronic component is part of the planar substrate or is fixedly connected to a surface of the planar substrate;
a pump light source is part of the planar substrate or is fixedly connected to a surface of the planar substrate;
the surface of the planar substrate includes a region covered with a solidified colloidal film, wherein the solidified colloidal film comprises a solidified colloidal varnish, wherein the solidified colloidal varnish comprises a carrier material;
the solidified colloidal film is firmly bonded to the surface of the planar substrate in the region that it covers; and
the solidified colloidal film comprises at least one aligned nanoparticle having a color center; wherein the aligned nanoparticle comprises an alignment aid, wherein the alignment aid determines alignment of at least one axis of the aligned nanoparticle;
and further wherein:
the solidified colloidal varnish and comprised carrier material of the solidified colloidal film are transparent in a spectral range of radiation that interacts with the color center;
the solidified colloidal varnish and the comprised carrier material of the solidified colloidal film are transparent in a spectral range of radiation comprising a pump radiation of the pump light source after curing;
the micro-optical functional element optically couples the color center of the aligned nanoparticle to the photosensitive electronic device;
the photosensitive electric device detects a luminescence of the color center;
at least one operating parameter of the microelectronic circuit is dependent on a value of an intensity of the luminescence of the color center detected by the photosensitive component;
the color center is coupled to the light-sensitive electrical component via the micro-optical functional element; and
the micro-optical functional element is adapted or intended to perform at least the function of one of the following micro-optical elements:
the function of an optical lens;
the function of a photonic crystal;
the function of an optical filter;
the function of an optical wholly or partly reflecting mirror;
the function of an optical waveguide;
the function of a directional coupler;
the function of a wave sump (waveguide absorber);
the function of a circulator; and/or
the function of a coupling and/or decoupling element.

12. An integrated circuit comprising a microelectronic circuit for use in a system according to claim 11, wherein:
the microelectronic circuit is manufactured in MOS technology or CMOS technology or BICMOS technology or bipolar technology and
the color center or a plurality of color centers is or are a functional element for the intended use of the integrated circuit.

13. The quantum computing system of claim 11, wherein:
the system comprises a microelectronic circuit fabricated in or on the planar substrate using MOS technology or CMOS technology or BICMOS technology or bipolar technology, and
the color center interacts with the microelectronic circuit or with parts thereof.

14. The quantum computing system according to claim 11, wherein:
the planar substrate is at least in part a semiconductor wafer and/or other semiconductor substrate or a silicon wafer or a GaAs wafer or a wafer of IV material or a wafer of III/V material or a wafer of II/VI material or a wafer of mixtures of such materials or a germanium wafer or a mono-or polycrystalline diamond wafer or a portion thereof; and
the planar substrate comprises a MOS circuit or a CMOS circuit or a BICMOS circuit or a bipolar circuit or another microelectronic circuit fabricated in or on the planar substrate; wherein:
there is an electromagnetic effective connection between the color center of the aligned nanoparticle and at least part of the MOS or CMOS or BICMOS or bipolar circuit or the other microelectronic circuit of the planar substrate.

15. The quantum computing system according to claim 14, wherein:
the MOS or CMOS or BICMOS or bipolar circuit or the other microelectronic circuit includes an electromagnetic component including an electromagnetic device and/or a magnetic field generating device and/or an electric field generating device; and
the electromagnetic component is intended and/or suitable for changing physical parameters and/or optical parameters of the color center or the electromagnetic component is intended and/or suitable for changing physical parameters and/or optical parameters of the color center as a function of states of the MOS or CMOS or BICMOS or bipolar circuit or of the other microelectronic circuit.

16. The quantum computing system according to claim 11, wherein:
the aligned nanoparticle has at least two color centers; and
the at least two color centers are intended and designed to interact with one another in a physically observable manner.

17. The quantum computing system according to claim 16, wherein:
the MOS or CMOS or BICMOS or bipolar circuit or the other microelectronic circuit has electrodes and/or magnetic field-generating device parts which are intended to detect and/or influence the interaction of the at least two color centers.

18. A quantum computing system, comprising:
a planar substrate;
a pump light source is part of the planar substrate or is fixedly connected to a surface of the planar substrate; and
a micro-optical functional element;
wherein:
the planar substrate is at least partly a glass wafer or a ceramic wafer or a plastic wafer or a piece of such glass wafer or ceramic wafer or plastic wafer or functionally equivalent shapes of glass or plastic or ceramic;
the planar substrate includes an imprinted and solidified colloidal film on at least a region of a surface of the planar substrate, the imprinted and solidified colloidal film being firmly bonded to the surface of the planar substrate;
the imprinted and solidified colloidal film comprises aligned nanoparticles; wherein each of the aligned nanoparticles comprises an alignment aid, wherein the alignment aid determines alignment of at least one axis of the aligned nanoparticles wherein at least some of the nanoparticles have one or more color centers;
the imprinted and solidified colloidal film comprises a solidified colloidal varnish; wherein the solidified colloidal varnish comprises a carrier material;
the solidified colloidal varnish and the comprised carrier material of the imprinted and solidified colloidal film are transparent to a spectral range of radiation that interacts with the color center;
the solidified colloidal varnish and the comprised carrier material of the imprinted and solidified colloidal film are transparent to a spectral range of radiation comprising a pump radiation of a pump light source; and
the color center is optically coupled to a micro-optical functional element;
and further wherein:
the micro-optical functional element is adapted or intended to perform at least the function of an optical wholly or partly reflecting mirror.

19. The quantum computing system according to claim 18, wherein:
the planar substrate is at least in part a glass wafer and/or a ceramic wafer and/or a metal sheet or a plastic sheet or a portion thereof;
the planar substrate includes a MOS circuit or a CMOS circuit or a BICMOS circuit or a bipolar circuit or another microelectronic circuit fabricated on the planar substrate; and
there is an electromagnetic effective connection between the color center of the aligned nanoparticle and at least a portion of the MOS or CMOS or BICMOS or bipolar circuitry or the other microelectronic circuitry of the planar substrate, wherein the aligned nanoparticle is aligned relative to the circuitry of the planar substrate.

20. The quantum computing system according to claim 19, wherein:
the MOS or CMOS or BICMOS or bipolar circuit or the other microelectronic circuit includes an electromagnetic component including an electromagnetic device and/or a magnetic field generating device and/or an electric field generating device; and
the electromagnetic component is intended and/or suitable for changing physical parameters and/or optical parameters of the one or more color centers or in that this electromagnetic component is intended and/or suitable for changing physical parameters and/or optical parameters of the one or more color centers as a function of states of the MOS or CMOS or BICMOS or bipolar circuit or of the other microelectronic circuit.

21. The quantum computing system according to claim 19, wherein:
the MOS or CMOS or BICMOS or bipolar circuit or the other microelectronic circuit has electrodes and/or magnetic field-generating device parts which are intended to detect and/or influence the interaction of at least two color centers.

22. The quantum computing system according to claim 21, wherein:
the MOS or CMOS or BICMOS or bipolar circuit or the other microelectronic circuit has electrodes and/or magnetic field-generating device parts which are intended to detect and/or influence the interaction of the at least two color centers.

23. The quantum computing system according to claim 18, wherein:
at least one of the nanoparticles has at least two color centers; and
the at least two color centers are intended and designed to interact with one another in a physically observable manner.

* * * * *